(12) United States Patent
Horii et al.

(10) Patent No.: US 9,653,301 B2
(45) Date of Patent: May 16, 2017

(54) SEMICONDUCTOR DEVICE HAVING ELECTRODE MADE OF HIGH WORK FUNCTION MATERIAL, METHOD AND APPARATUS FOR MANUFACTURING THE SAME

(71) Applicant: HITACHI KOKUSAI ELECTRIC INC., Tokyo (JP)

(72) Inventors: Sadayoshi Horii, Toyama (JP); Arito Ogawa, Toyama (JP); Hideharu Itatani, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/228,840

(22) Filed: Aug. 4, 2016

(65) Prior Publication Data

US 2016/0343573 A1    Nov. 24, 2016

Related U.S. Application Data

(60) Division of application No. 14/629,345, filed on Feb. 23, 2015, now Pat. No. 9,437,704, and a continuation
(Continued)

(30) Foreign Application Priority Data

Jan. 7, 2010   (JP) .................................. 2010-002256

(51) Int. Cl.
*H01L 21/28* (2006.01)
*C23C 16/06* (2006.01)
(Continued)

(52) U.S. Cl.
CPC ........ *H01L 21/28088* (2013.01); *C23C 16/06* (2013.01); *C23C 16/34* (2013.01);
(Continued)

(58) Field of Classification Search
CPC  H01L 29/4966; H01L 28/75; H01L 21/28088
See application file for complete search history.

(56) References Cited

U.S. PATENT DOCUMENTS 6,271,133 B1    8/2001  Lim et al.
2001/0025999 A1  10/2001  Suguro
(Continued)

FOREIGN PATENT DOCUMENTS

JP    2001-274380 A    10/2001
JP    2005-244186       9/2005
(Continued)

*Primary Examiner* — Tucker J Wright
(74) *Attorney, Agent, or Firm* — Volpe and Koenig, P.C.

(57) ABSTRACT

Provided is a semiconductor device including a metal film which can be formed with lower costs but still manage to have a necessary work function and oxidation resistance. The semiconductor device includes an insulating film disposed on a substrate; and a metal film disposed on the insulating film. The metal film includes a stacked structure of: a first metal film disposed on the insulating film to directly contact the insulating film; a second metal film disposed on the first metal film to directly contact the first metal film; and the first metal film disposed on the second metal film to directly contact the second metal film, the second metal film having a work function greater than 4.8 eV and being different from the first metal film in material, wherein an oxidation resistance of the first metal film is greater than that of the second metal film.

11 Claims, 22 Drawing Sheets

Related U.S. Application Data of application No. 12/984,018, filed on Jan. 4, 2011, now abandoned.

(51) Int. Cl.

| | | |
|---|---|---|
| *C23C 16/34* | (2006.01) | |
| *C23C 16/455* | (2006.01) | |
| *H01L 49/02* | (2006.01) | |
| *H01L 29/49* | (2006.01) | |
| *H01L 29/51* | (2006.01) | |
| *H01L 21/768* | (2006.01) | |
| *H01L 23/522* | (2006.01) | |

(52) U.S. Cl.
CPC .. *C23C 16/45529* (2013.01); *H01L 21/28194* (2013.01); *H01L 28/75* (2013.01); *H01L 29/4966* (2013.01); *H01L 29/517* (2013.01); *H01L 21/7687* (2013.01); *H01L 23/5223* (2013.01); *H01L 2924/0002* (2013.01)

(56) References Cited

U.S. PATENT DOCUMENTS

| | | |
|---|---|---|
| 2004/0164362 A1 | 8/2004 | Conley, Jr. et al. |
| 2004/0203229 A1 | 10/2004 | Fang et al. |
| 2005/0082625 A1 | 4/2005 | Kim et al. |
| 2006/0237796 A1 | 10/2006 | Cartier et al. |
| 2008/0076216 A1 | 3/2008 | Pae et al. |
| 2009/0321936 A1 | 12/2009 | Kojima et al. |
| 2009/0325372 A1 | 12/2009 | Harada |

FOREIGN PATENT DOCUMENTS

| | | |
|---|---|---|
| JP | 2008-028058 | 2/2008 |
| JP | 2008-537359 | 9/2008 |

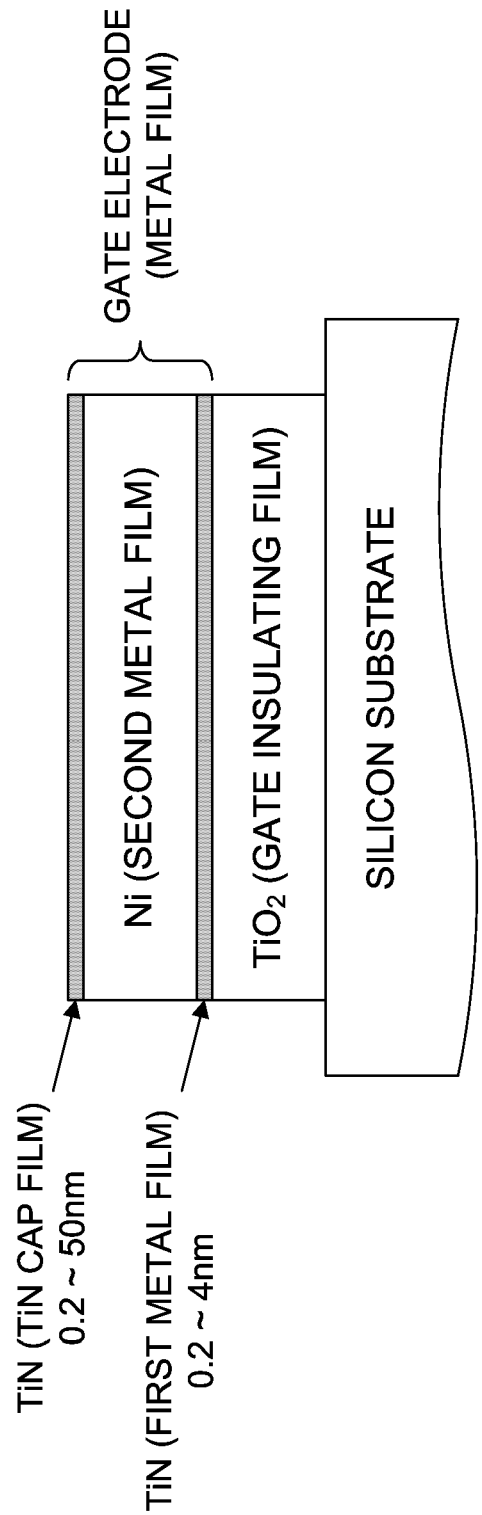

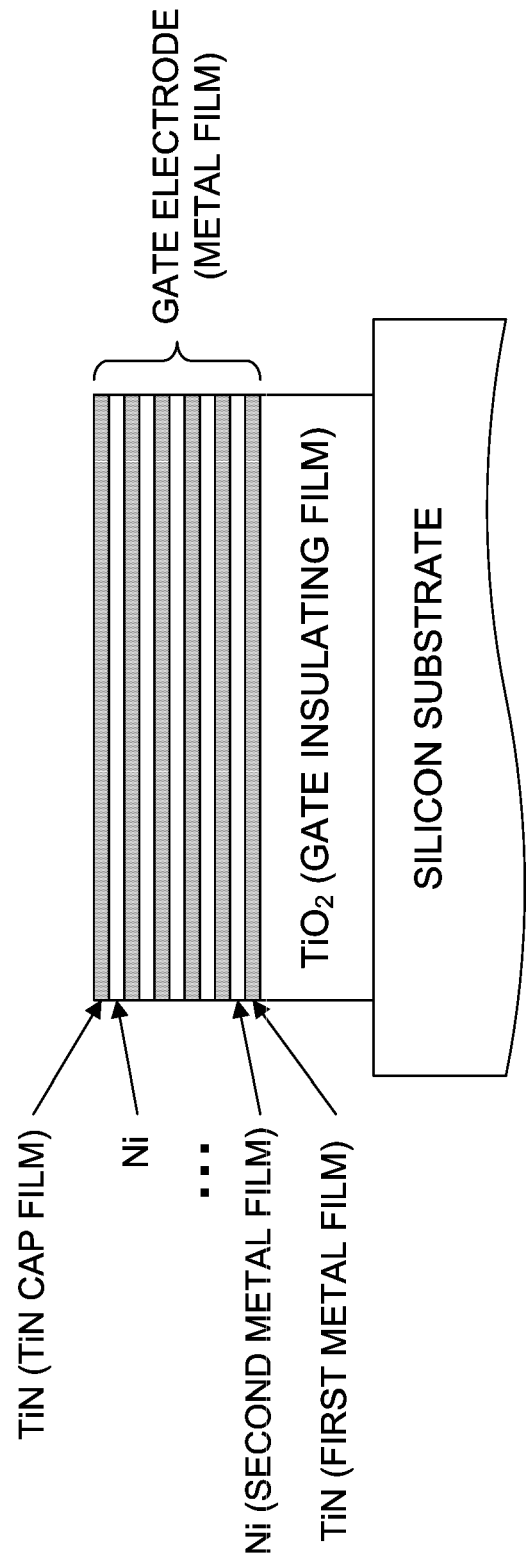

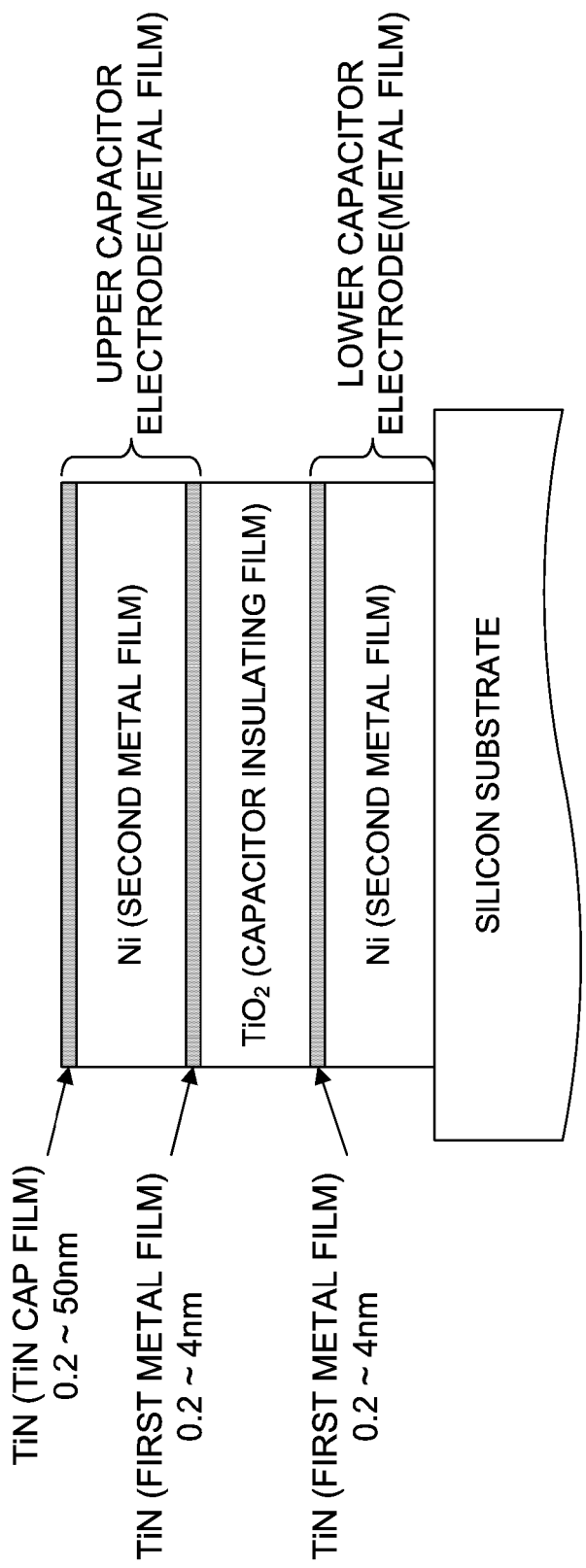

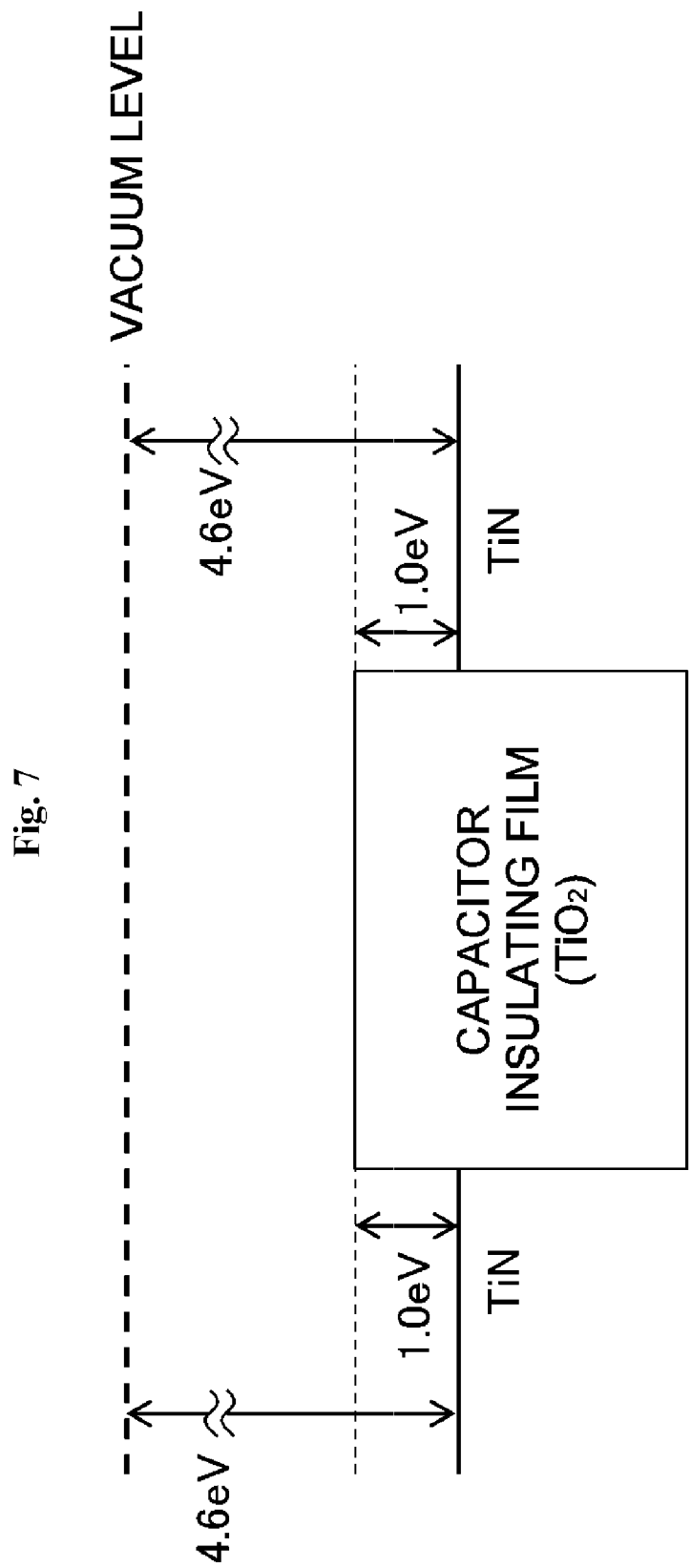

Fig. 10

| METAL | ELECTRONEGATIVITY | WORK FUNCTION (eV) |
|---|---|---|
| Be | 1.57 | 4.98 |
| C | 2.55 | 5 |
| Co | 1.88 | 5 |
| Ni | 1.91 | 5.15 |
| Se | 2.55 | 5.9 |
| Te | 2.1 | 4.95 |
| Re | 1.9 | 4.96 |

SEMICONDUCTOR DEVICE HAVING ELECTRODE MADE OF HIGH WORK FUNCTION MATERIAL, METHOD AND APPARATUS FOR MANUFACTURING THE SAME

CROSS-REFERENCE TO RELATED PATENT APPLICATION

This U.S. non-provisional patent application and is a division of U.S. patent application Ser. No. 14/629,345 filed on Feb. 23, 2015 which is a Continuation of U.S. patent application Ser. No. 12/984,018 filed on Jan. 4, 2011, and claims priority under 35 U.S.C. §119 of Japanese Patent Application No. 2010-002256, filed on Jan. 7, 2010, respectively, in the Japanese Patent Office, the entire contents of which are hereby incorporated by reference.

BACKGROUND OF THE INVENTION

Field of the Invention

The present invention relates to a semiconductor device, a method of manufacturing a semiconductor device, and a substrate processing apparatus.

Description of the Related Art

To highly integrate metal-oxide-semiconductor field effect transistors (MOSFETs) and increase the performance of the MOSFETs, the use of a high-k/metal gate structure is considered, which is constituted by a gate insulating film made of a high permittivity insulating material (high-k material) and a gate electrode made of a metal. In the case of a p-channel metal-oxide semiconductor (PMOS) transistor, it is preferable that a gate electrode is made of a metal having a high work function of about 4.8 eV to 5.1 eV, and for example, it is considered that a gate electrode is made of a noble metal such as platinum (Pt).

Furthermore, in the case of a dynamic random access memory (DRAM), it is considered that a capacitor insulating film is made of a high permittivity insulating material such as a hafnium dioxide ($HfO_2$), a zirconium dioxide ($ZrO_2$), a titanium dioxide ($TiO_2$), a tantalum pentoxide ($Ta_2O_5$), and a niobium pentoxide ($Nb_2O_5$). In addition, a leak current of a capacitor part can be effectively reduced by forming a capacitor electrode using a metal having a high work function. Thus, when a capacitor insulating film is made of $HfO_2$ or $ZrO_2$ having a wide band gap, a capacitor electrode is made of a material such as a titanium nitride (TiN) having a work function of about 4.6 eV. In addition, when a capacitor insulating film is made of $TiO_2$ or $Nb_2O_5$ having a narrow band gap, a capacitor electrode is made of a noble metal such as Pt having a high work function of about 5.1 eV.

However, if a metal film (for example, a gate electrode, a capacitor electrode, etc.) is made of an expensive noble metal such as Pt, the manufacturing costs of a semiconductor device may be increased. In addition, it is difficult to form a thin film by using a noble metal such as Pt. It can be considered that another metal having a high work function such as nickel (Ni) or cobalt (Co) is used instead of a noble metal such as Pt. However, such a metal is easily oxidized, and if a metal film (a gate electrode or a capacitor electrode) is oxidized, the equivalent oxide thickness (EOT) of the metal film may be increased.

SUMMARY OF THE INVENTION

An object of the present invention is to provide a semiconductor device including a metal film which can be formed with lower costs but have a necessary work function and oxidation resistance. Another object of the present invention is to provide a method of manufacturing a semiconductor device and a substrate processing apparatus, which are designed to form a metal film having a necessary work function and oxidation resistance with lower costs.

According to an aspect of the present invention, there is provided a semiconductor device including: an insulating film disposed on a substrate; and a metal film disposed on the insulating film, the metal film including a stacked structure of: a first metal film disposed on the insulating film to directly contact the insulating film; a second metal film disposed on the first metal film to directly contact the first metal film; and the first metal film disposed on the second metal film to directly contact the second metal film, the second metal film having a work function greater than 4.8 eV and being different from the first metal film in material, wherein an oxidation resistance of the first metal film is greater than that of the second metal film.

According to another aspect of the present invention, there is provided a method of manufacturing a semiconductor device, the method including: forming an insulating film on a substrate; and forming a metal film including a stacked structure of: a first metal film disposed on the insulating film to directly contact the insulating film; and a second metal film disposed on the first metal film to directly contact the first metal film, the second metal film having a work function greater than 4.8 eV and being different from the first metal film in material, wherein an oxidation resistance of the first metal film is greater than that of the second metal film.

According to another aspect of the present invention, there is provided a substrate processing apparatus including: a process chamber configured to process a substrate; a first process gas supply system configured to supply a first process gas into the process chamber to form a first metal film; a second process gas supply system configured to supply a second process gas into the process chamber to form a second metal film; and a controller configured to control the first process gas supply system and the second process gas supply system, wherein an oxidation resistance of the first metal film is greater than that of the second metal film, the second metal film has a work function greater than 4.8 eV and is different from the first metal film in material, and the controller controls the first process gas supply system and the second process gas supply system to form a metal film having a stacked structure of the first metal film and the second metal film adjacent to an insulating film disposed on the substrate by supplying the first process gas and the second process gas into the process chamber where the substrate is accommodated such that the first metal film is formed between the second metal film and the insulating film.

BRIEF DESCRIPTION OF THE DRAWINGS

FIG. 5A is a sectional view illustrating a gate electrode formed by performing a TiN film-forming process and a Ni film-forming process once, and FIG. 5B is sectional view illustrating a gate electrode formed by performing the TiN film-forming process and the Ni film-forming process a plurality of times.

FIG. 6A is a sectional view illustrating a capacitor electrode formed by performing a TiN film-forming process and a Ni film-forming process once.

FIG. 7 is a schematic view illustrating the energy level of a conventional capacitor electrode constituted by a single layer of TiN film.

FIG. 10 is a table illustrating a group of metals having work functions higher than 4.8 eV which can be used for forming a second metal film.

FIG. 17A and FIG. 17B are schematic views illustrating a vertical process furnace of a vertical apparatus according to another embodiment of the present invention, in which FIG. 17A is a vertical sectional view illustrating the vertical process furnace and FIG. 17B is a sectional view of the vertical process furnace taken along line A-A of FIG. 17A.

DETAILED DESCRIPTION OF THE PREFERRED EMBODIMENTS

Embodiment of Invention (1) Structure of Substrate Processing Apparatus

Figure 3:
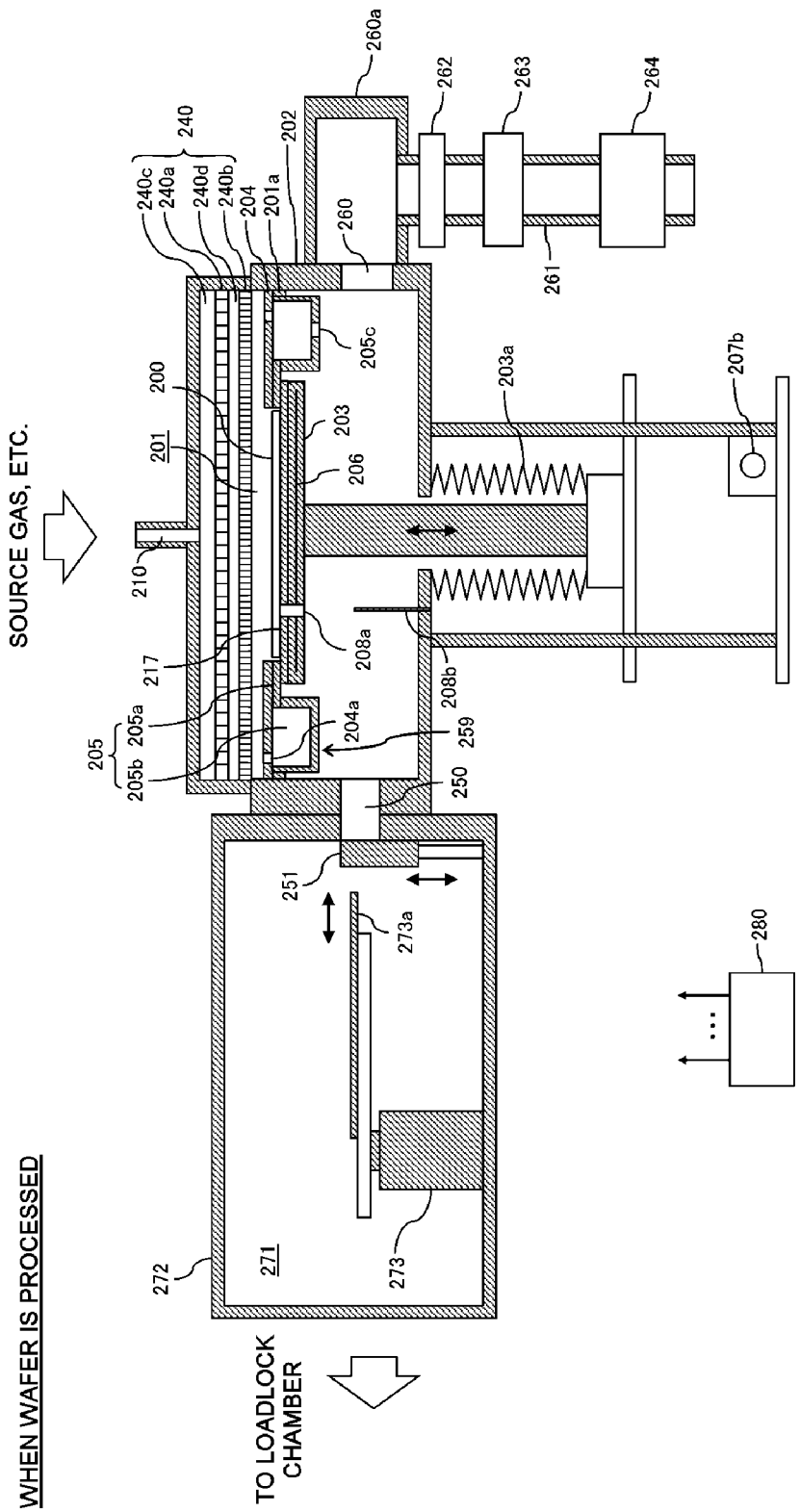
FIG. 3 is a sectional view illustrating the substrate processing apparatus when a wafer is processed according to the embodiment of the present invention.

First, the structure of a substrate processing apparatus relevant to the current embodiment will be described with reference to FIG. 3 and FIG. 4. FIG. 3 is a sectional view illustrating the substrate processing apparatus when a wafer is processed according to an embodiment of the present invention, and FIG. 4 is a sectional view illustrating the substrate processing apparatus when the wafer is carried according to the embodiment of the present invention.

(Process Chamber)

Figure 4:
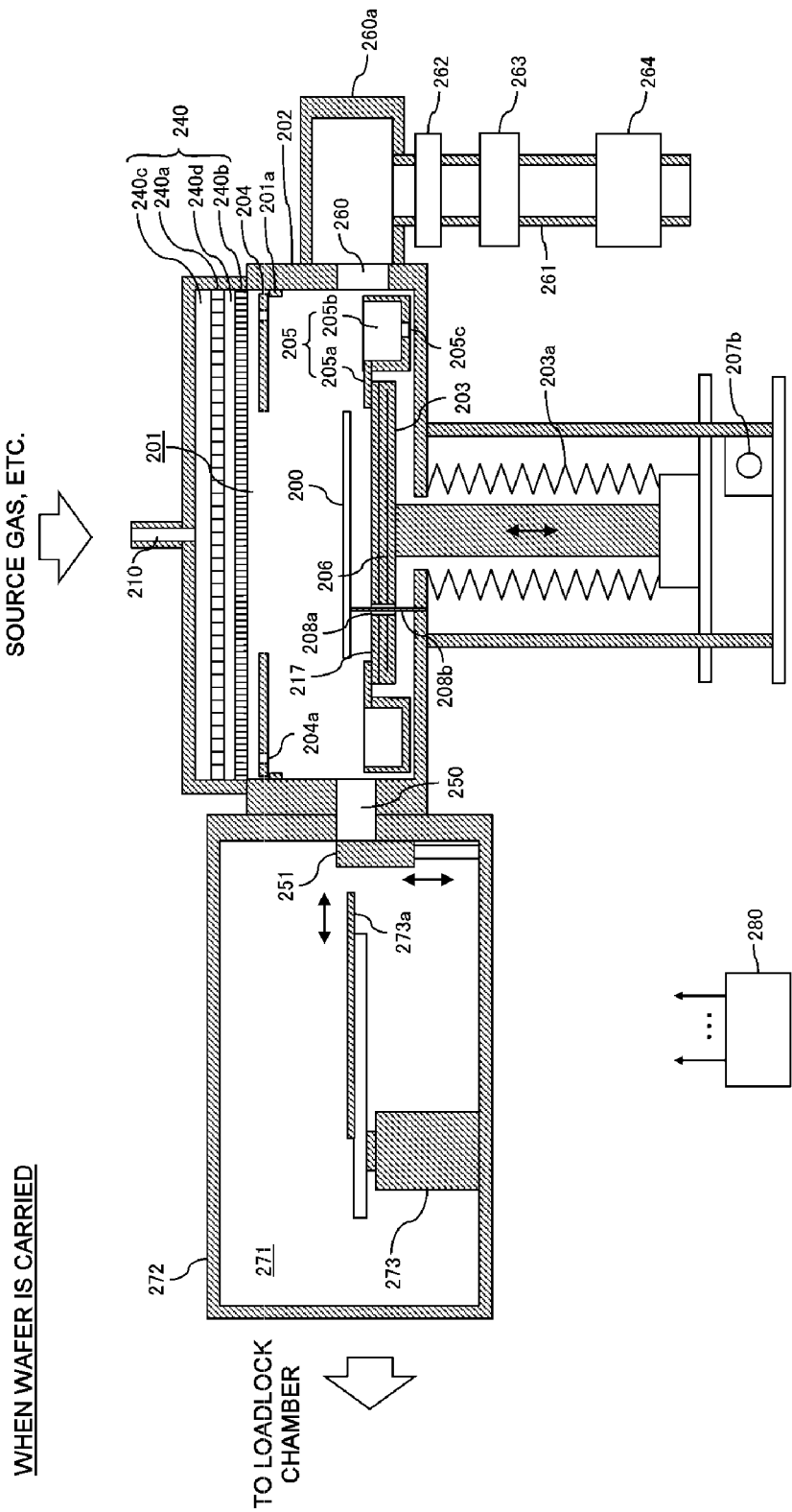
FIG. 4 is a sectional view illustrating the substrate processing apparatus when a wafer is carried according to the embodiment of the present invention.

As shown in FIG. 3 and FIG. 4, the substrate processing apparatus relevant to the current embodiments includes a process vessel 202. For example, the process vessel 202 is a flat airtight vessel having a circular cross sectional shape. In addition, the process vessel 202 is made of a metal material such as aluminum or stainless steel (e.g., SUS described in the Japanese industrial standard). In the process vessel 202, a process chamber 201 is formed to process a substrate such as a wafer 200 (e.g., a silicon wafer).

(Support Stage)

In the process chamber 201, a support stage 203 is installed to support a wafer 200. On the top surface of the support stage 203 that makes direct contact with the wafer 200, a susceptor 217 made of a material such as quartz ($SiO_2$), carbon, a ceramic material, silicon carbide (SiC), aluminum oxide ($Al_2O_3$), or aluminum nitride (AlN) is installed as a support plate.

In the support stage 203, a heater 206 is built as a heating unit (heating source) configured to heat the wafer 200. The lower end part of the support stage 203 penetrates the bottom side of the process vessel 202.

(Elevating Mechanism)

At the outside of the process chamber 201, an elevating mechanism 207b is installed to raise and lower the support stage 203. By operating the elevating mechanism 207b to raise and lower the support stage 203, the wafer 200 supported on the susceptor 217 can be raised and lowered. When the wafer 200 is carried, the support stage 203 is lowered to a position (wafer carrying position) shown in FIG. 4, and when the wafer 200 is processed, the support stage 203 is raised to a position (wafer processing position) shown in FIG. 3. The lower end part of the support stage 203 is surrounded by a bellows 203a so that the inside of the process chamber 201 can be hermetically maintained.

(Lift Pins)

In addition, on the bottom surface (floor surface) of the process chamber 201, for example, three lift pins 208b are installed in a manner such that the lift pins 208b are vertically erected. Furthermore, in the support stage 203 (including the susceptor 217), penetration holes 208a are respectively formed at positions corresponding to the lift pins 208b so that the lift pins 208b can be inserted through the penetration holes 208a. Therefore, when the support stage 203 is lowered to the wafer carrying position, as shown in FIG. 4, upper parts of the lift pins 208b protrude from the top surface of the susceptor 217 so that the lift pins 208b can support the wafer 200 from the bottom side of the wafer 200.

In addition, when the support stage 203 is raised to the wafer processing position, as shown in FIG. 3, the lift pins 208b are retracted from the top surface of the susceptor 217 so that the susceptor 217 can support the wafer 200 from the bottom side of the wafer 2. Since the lift pins 208b make direct contact with the wafer 200, it is preferable that the lift pins 208b are made of a material such as quartz or alumina.

(Wafer Carrying Entrance)

At a side of the inner wall of the process chamber 201 (process vessel 202), a wafer carrying entrance 250 is installed so that a wafer 200 can be carried into and out of the process chamber 201 through wafer carrying entrance 250. At the wafer carrying entrance 250, a gate valve 251 is installed so that the inside of the process chamber 201 can communicate with the inside of a carrying chamber (preliminary chamber) 271 by opening the gate valve 251. The carrying chamber 271 is formed in a carrying vessel (airtight vessel) 272. In the carrying chamber 271, a carrying robot 273 is installed to carry a wafer 200. The carrying robot 273 includes a carrying arm 273a to support a wafer 200 when the wafer 200 is carried. In a state where the support stage 203 is lowered to the wafer carrying position, if the gate valve 251 is opened, a wafer 200 can be carried between the inside of the process chamber 201 and the inside of the carrying chamber 271 by using the carrying robot 273. A wafer 200 carried into the process chamber 201 is temporarily placed on the lift pins 208b as described above. In addition, at a side of the carrying chamber 271 opposite to the wafer carrying entrance 250, a loadlock chamber (not shown) is installed, and a wafer 200 can be carried between the inside of the loadlock chamber and the inside of the carrying chamber 271 by using the carrying robot 273. The loadlock chamber is used as a preliminary chamber to temporarily accommodate a non-processed or processed wafer 200.

(Exhaust System)

At a side of the inner wall of the process chamber 201 (process vessel 202) opposite to the wafer carrying entrance 250, an exhaust outlet 260 is installed for exhausting the inside atmosphere of the process chamber 201. An exhaust pipe 261 is connected to the exhaust outlet 260 through an exhaust chamber 260a, and at the exhaust pipe 261, a pressure regulator 262 such as an auto pressure controller (APC) configured to control the inside pressure of the process chamber 201, a source collection trap 263, and a vacuum pump 264 are sequentially connected in series. An exhaust system (exhaust line) is constituted mainly by the exhaust outlet 260, the exhaust chamber 260a, the exhaust pipe 261, the pressure regulator 262, the source collection trap 263, and the vacuum pump 264.

(Gas Inlet)

At the top surface (the ceiling wall) of a shower head 240 (described later) installed at an upper part of the process chamber 201, a gas inlet 210 is installed to introduce various gases into the process chamber 201. A gas supply system connected to the gas inlet 210 will be described later.

(Shower Head)

Between the gas inlet 210 and the process chamber 201, the shower head 240 is installed as a gas distributing mechanism. The shower head 240 includes a distributing plate 240a configured to distribute a gas introduced through the gas inlet 210, and a shower plate 240b configured to distribute the gas passing through the distributing plate 240a more uniformly and supply the gas to the surface of the wafer 200 placed on the support stage 203. A plurality of ventilation holes are formed in the distributing plate 240a and the shower plate 240b. The distributing plate 240a is disposed to face the top surface of the shower head 240 and the shower plate 240b, and the shower plate 240b is disposed to face the wafer 200 placed on the support stage 203. Between the top surface of the shower head 240 and the distributing plate 240a and between the distributing plate 240a and the shower plate 240b, spaces are provided which function as a first buffer space (distributing chamber) 240c through which gas supplied through the gas inlet 210 is distributed and a second buffer space 240d through which gas passing through the distributing plate 240a is diffused.

(Exhaust Duct)

In the side surface of the inner wall of the process chamber 201 (process vessel 202), a stopper 201a is installed. The stopper 201a is configured to hold a conductance plate 204 at a position adjacent to the wafer processing position. The conductance plate 204 is configured as a doughnut-shaped (ring-shaped) circular disk having an opening to accommodate the wafer 200 in its inner circumferential part. A plurality of discharge outlets 204a are formed in the outer circumferential part of the conductance plate 204 in a manner such that the discharge outlets 204a are arranged at predetermined intervals in the circumferential direction of the conductance plate 204. The discharge outlets 204a are discontinuously formed so that the outer circumferential part of the conductance plate 204 can support the inner circumferential part of the conductance plate 204.

A lower plate 205 latches onto the outer circumferential part of the support stage 203. The lower plate 205 includes a ring-shaped concave part 205b and a flange part 205a formed in one piece with the inner upper side of the concave part 205b. The concave part 205b is installed to close a gap between the outer circumferential part of the support stage 203 and the side surface of the inner wall of the process chamber 201. At a part of the lower side of the concave part 205b adjacent to the exhaust outlet 260, a plate exhaust outlet 205c is formed to discharge (distribute) gas from the inside of the concave part 205b toward the exhaust outlet 260. The flange part 205a functions as a latching part that latches onto the upper outer circumferential part of the support stage 203. Since the flange part 205a latches onto the upper outer circumferential part of the support stage 203, the lower plate 205 can be lifted together with the support stage 203 when the support stage 203 is lifted.

When the support stage 203 is raised to the wafer processing position, the lower plate 205 is also raised to the wafer processing position. As a result, the top surface of the concave part 205b of the lower plate 205 is blocked by the conductance plate 204 held at a position adjacent to the wafer processing position, and thus a gas flow passage region is formed in the concave part 205b as an exhaust duct 259. At this time, by the exhaust duct 259 (the conductance plate 204 and the lower plate 205) and the support stage 203, the inside of the process chamber 201 is divided into an upper process chamber higher than the exhaust duct 259 and a lower process chamber lower than the exhaust duct 259. Preferably, the conductance plate 204 and the lower plate 205 may be formed of a material that is durable at a high temperature, for example, high temperature resistant and high load resistant quartz, for the case where reaction products deposited on the inner wall of the exhaust duct 259 are etched away (for the case of self cleaning).

An explanation will now be given on a gas flow in the process chamber 201 during a wafer processing process. First, gas supplied from the gas inlet 210 to the upper side of the shower head 240 flows from the first buffer space (distributing chamber) 240c to the second buffer space 240d through the plurality of holes of the distributing plate 240a, and is then supplied to the inside of the process chamber 201 through the plurality of holes of the shower plate 240b, so that the gas can be uniformly supplied to the wafer 200. Then, the gas supplied to the wafer 200 flows outward in the radial directions of the wafer 200. After the gas makes contact with the wafer 200, remaining gas is discharged to the exhaust duct 259 disposed at the outer circumference of the wafer 200: that is, the remaining gas flows outward on the conductance plate 204 in the radial directions of the wafer 200 and is discharged to the gas flow passage region (the inside of the concave part 205b) of the exhaust duct 259 through the discharge outlets 204a formed in the conductance plate 204. Thereafter, the gas flows in the exhaust duct 259 and is exhaust through the plate exhaust outlet 205c and the exhaust outlet 260. Since gas is guided to flow in this manner, the gas may be prevented from flowing to the lower part of the process chamber 201. That is, the gas may be prevented from flowing to the rear side of the support stage 203 or the bottom side of the process chamber 201.

<Gas Supply System>

Figure 2:
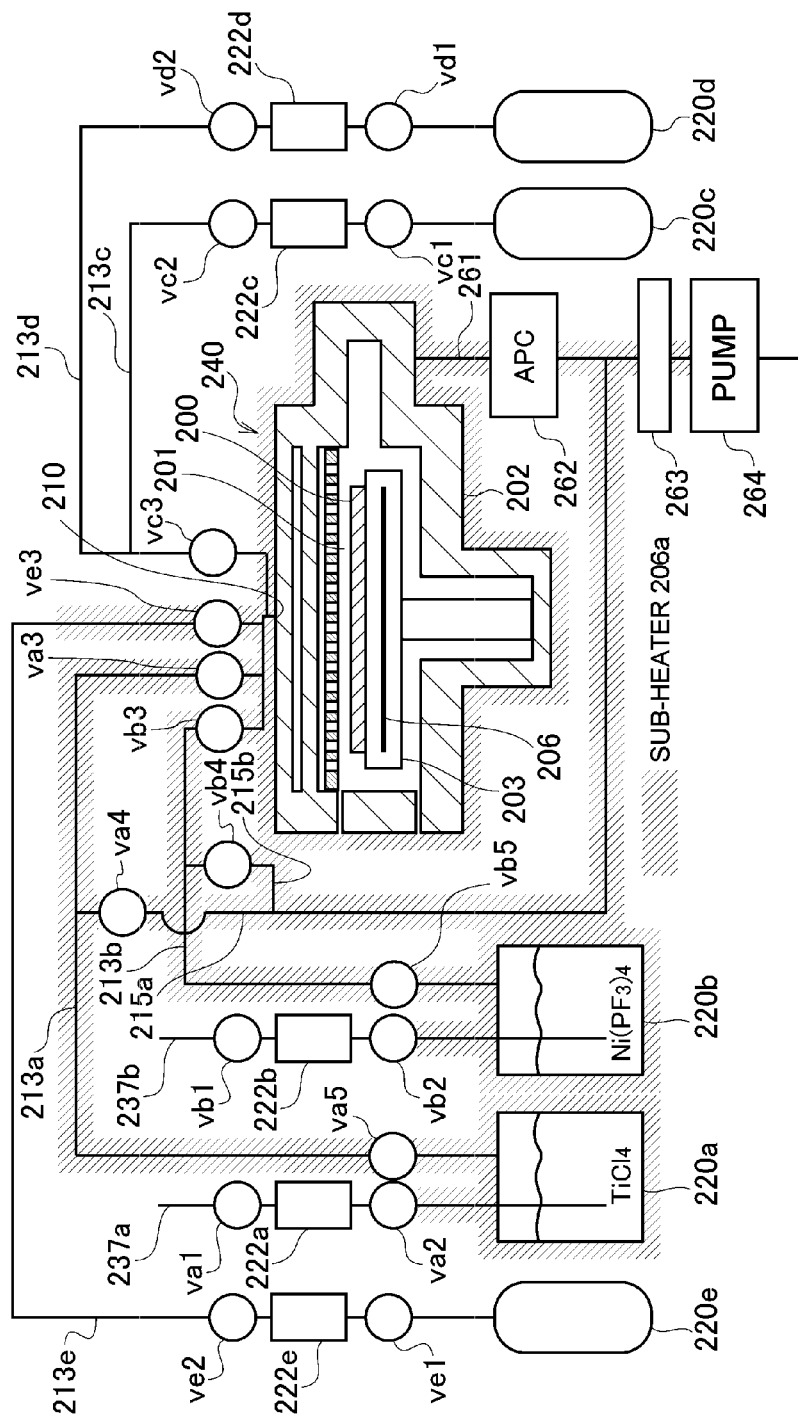
FIG. 2 is a view illustrating a gas supply system of a substrate processing apparatus relevant to the embodiment of the present invention.

Next, the configuration of the gas supply system connected to the gas inlet 210 will be described with reference to FIG. 2. FIG. 2 illustrates the configuration of the gas supply system (gas supply lines) of the substrate processing apparatus relevant to the embodiment of the present invention.

The gas supply system of the substrate processing apparatus of the current embodiment includes: a bubbler as a vaporizing unit configured to vaporize a liquid source which is liquid at room temperature; a source gas supply system configured to supply a source gas, which is obtained by vaporizing the liquid source using the bubbler, into the process chamber 201; and a reaction gas supply system configured to supply a reaction gas different from the source gas into the process chamber 201. In addition, the substrate processing apparatus of the current embodiment includes a purge gas supply system configured to supply a purge gas into the process chamber 201, and a vent (bypass) system so as not to supply a source gas generated from the bubbler into the process chamber 201 but to exhaust the source gas through a passage bypassing the process chamber 201. Next, the structure of each part will be described.

<Bubbler>

At the outside of the process chamber 201, a first source container (first bubbler) 220a is installed which contains a first source (source A) which is a liquid source, and a second source container (second bubbler) 220b is installed which contains a second source (source B) which is a liquid source. Each of the first and second bubblers 220a and 220b is configured as a tank (airtight container) in which a liquid source can be stored (filled). In addition, the first and second the bubblers 220a and 220b are configured as vaporizing units capable of generating a first source gas and a second source gas by vaporizing a first source and a second source through bubbling. In addition, sub-heaters 206a are installed around the first bubbler 220a and the second bubbler 220b to heat the first and second bubblers 220a and 220b and liquid sources filled in the first and second bubblers 220a and 220b. For example, a metal liquid source containing titanium (Ti) such as titanium tetrachloride ($TiCl_4$) may be used as the first source, and a metal liquid source containing nickel (Ni) such as tetrakis(trifluorophosphine)nickel (Ni$(PF_3)_4$) may be used as the second source.

A first carrier gas supply pipe 237a and a second carrier gas supply pipe 237b are connected to the first bubbler 220a and the second bubbler 220b, respectively. Carrier gas supply sources (not shown) are connected to the upstream end parts of the first carrier gas supply pipe 237a and the second carrier gas supply pipe 237b. In addition, the downstream end parts of the first carrier gas supply pipe 237a and the second carrier gas supply pipe 237b are placed in the liquid sources filled in the first bubbler 220a and the second bubbler 220b, respectively. A mass flow controller (MFC) 222a which is a flow rate controller configured to control the supply flow rate of a carrier gas, and valves va1 and va2 configured to control supply of the carrier gas are installed at the first carrier gas supply pipe 237a. A mass flow controller (MFC) 222b which is a flow rate controller configured to control the supply flow rate of a carrier gas, and valves vb1 and vb2 configured to control supply of the carrier gas are installed at the second carrier gas supply pipe 237b. Preferably, a gas that does not react with the liquid sources may be used as the carrier gas. For example, inert gas such as $N_2$ gas and Ar gas may be used as the carrier gas. A first carrier gas supply system (first carrier gas supply line) is constituted mainly by the first carrier gas supply pipe 237a, the MFC 222a, and the valves va1 and va2, and a second carrier gas supply system (second carrier gas supply line) is constituted mainly by the second carrier gas supply pipe 237b, the MFC 222b, and the valves vb1 and vb2.

In the above-described structure, the valves va1, va2, vb1, and vb2 are opened, and a carrier gas the flow rates of which are controlled by the MFC 222a and the MFC 222b is supplied from the first carrier gas supply pipe 237a and the second carrier gas supply pipe 237b into the first bubbler 220a and the second bubbler 220b. Then, the liquid sources filled in the first and second bubblers 220a and 220b are vaporized by bubbling, and thus source gases are generated.

The supply flow rates of the first source gas and the second source gas may be calculated from the supply flow rates of the carrier gas. That is, the supply flow rates of the first source gas and the second source gas may be controlled by adjusting the supply flow rates of the carrier gas.

<Source Gas Supply System>

A first source gas supply pipe 213a and a second source gas supply pipe 213b are respectively connected to the first bubbler 220a and the second bubbler 220b to supply the first source gas and the second source gas generated in the first bubbler 220a and the second bubbler 220b into the process chamber 201. The upstream end parts of the first and second source gas supply pipes 213a and 213b communicate with inner upper spaces of the first and second bubblers 220a and 220b. The downstream end parts of the first and second source gas supply pipes 213a and 213b are joined together and then connected to the gas inlet 210.

In addition, valves va5 and va3 are sequentially installed from the upstream side of the first source gas supply pipe 213a. The valve va5 is configured to control supply of the first source gas from the first bubbler 220a to the first source gas supply pipe 213a, and the valve va5 is installed at a position adjacent to the first bubbler 220a. The valve va3 is configured to control supply of the first source gas from the first source gas supply pipe 213a to the process chamber 201, and the valve va3 is installed at a position adjacent to the gas inlet 210. In addition, valves vb5 and vb3 are sequentially installed from the upstream side of the second source gas supply pipe 213b. The valve vb5 is configured to control supply of the second source gas from the second bubbler 220b to the second source gas supply pipe 213b, and the valve vb5 is installed at a position adjacent to the second bubbler 220b. The valve vb3 is configured to control supply of the second source gas from the second source gas supply pipe 213b to the process chamber 201, and the valve vb3 is installed at a position adjacent to the gas inlet 210. The valves va3 and vb3, and a valve ve3 (described later) are highly-durable, high-speed valves. Highly-durable, high-speed valves are integrated valves configured to rapidly switch supply of gas, interruption of gas supply, and exhaustion of gas. The valve ve3 controls introduction of a purge gas so as to rapidly purge a space of the first source gas supply pipe 213a between the valve va3 and the gas inlet 210 and a space of the second source gas supply pipe 213b between the valve vb3 and the gas inlet 210, and then to purge the inside of the process chamber 201.

In the above-described structure, the liquid sources are vaporized in the first and second bubblers 220a and 220b to generate the first and second source gases, and along with this, the valves va5, va3, vb5, and vb3 are opened, so that the first and second source gases can be supplied into the process chamber 201 from the first and second source gas supply pipes 213a and 213b. A first source gas supply system (first source gas supply line) is constituted mainly by the first source gas supply pipe 213a and the valve va5 and va3, and a second source gas supply system (second source gas supply line) is constituted mainly by the second source gas supply pipe 213b and the valves vb5 and vb3.

A first source supply system (first source supply line) is constituted mainly by the first carrier gas supply system, the first bubbler 220a, and the first source gas supply system; and a second source supply system (second source supply line) is constituted mainly by the second carrier gas supply system, the second bubbler 220b, and the second source gas supply system. A first process gas supply system is constituted by the first source supply system and a reaction gas supply system (described later), and a second process gas supply system is constituted by the second source gas supply system.

<Reaction Gas Supply System>

In addition, at the outside of the process chamber 201, a reaction gas supply source 220c is installed to supply a reaction gas. The upstream end part of a reaction gas supply pipe 213c is connected to the reaction gas supply source 220c. The downstream end part of the reaction gas supply pipe 213c is connected to the gas inlet 210 through a valve vc3. An MFC 222c which is a flow rate controller configured to control the supply flow rate of a reaction gas, and valves vc1 and vc2 configured to control supply of the reaction gas are installed at the reaction gas supply pipe 213c. For example, ammonia ($NH_3$) gas may be used as the reaction gas. A reaction gas supply system (reaction gas supply line) is constituted mainly by the reaction gas supply source 220c, the reaction gas supply pipe 213c, the MFC 222c, and the valves vc1, vc2, and vc3.

<Purge Gas Supply System>

In addition, at the outside of the process chamber 201, purge gas supply sources 220d and 220e are installed to supply a purge gas. The upstream end parts of purge gas supply pipes 213d and 213e are connected to the purge gas supply sources 220d and 220e, respectively. The downstream end part of the purge gas supply pipe 213d is joined to the reaction gas supply pipe 213c and is connected to the gas inlet 210 through the valve vc3. The downstream end part of the purge gas supply pipe 213e is joined to the first source gas supply pipe 213a and the second source gas supply pipe 213b and is connected to the gas inlet 210 through the valve ve3. At the purge gas supply pipes 213d and 213e, MFCs 222d and 222e are respectively installed as flow rate controllers configured to control the supply flow rates of purge gas, and valves vd1, vd2, ve1, and ve2, are respectively installed to control supplies of purge gas. For example, inert gas such as $N_2$ gas and Ar gas may be used as a purge gas. A purge gas supply system (purge gas supply line) is constituted mainly by the purge gas supply sources 220d and 220e, the purge gas supply pipes 213d and 213e, the MFCs 222d and 222e, the valves vd1, vd2, vc3, ve1, ve2, and ve3.

<Vent (Bypass) System>

In addition, the upstream end parts of a first vent pipe 215a and a second vent pipe 215b are respectively connected to the upstream sides of the valves va3 and vb3 of the first and second source gas supply pipes 213a and 213b. In addition, the downstream end parts of the first and second vent pipes 215a and 215b are joined together and connected between the downstream side of the pressure regulator 262 and the upstream side of the source collection trap 263 of the exhaust pipe 261. At the first and second vent pipes 215a and 215b, valves va4 and vb4 are respectively installed to control flows of gases.

In the above-described structure, by closing the valves va3 and vb3 and opening the valves va4 and vb4, gases flowing in the first and second source gas supply pipes 213a and 213b can be allowed to bypass the process chamber 201 through the first and second vent pipes 215a and 215b without being supplied into the process chamber 201, and then the gases can be exhausted to the outside of the process chamber 201 through the exhaust pipe 261. A first vent system is constituted mainly by the first vent pipe 215a, the valve va4, and a second vent system is constituted mainly by the second vent pipe 215b and the valve vb4.

The sub-heaters 206a are also installed around the first and second vent pipes 215a and 215b. In addition, the sub-heaters 206a are also installed around other members such as the first carrier gas supply pipe 237a, the second carrier gas supply pipe 237b, the first source gas supply pipe 213a, the second source gas supply pipe 213b, the exhaust pipe 261, the process vessel 202, and the shower head 240. The sub-heater 206a is configured to heat such members to, for example, 100° C. or lower, so as to prevent the first and second source gases from changing back to liquid in the members.

<Controller>

The substrate processing apparatus relevant to the current embodiment includes a controller 280 configured to control each part of the substrate processing apparatus. The controller 280 controls operations of parts such as the gate valve 251, the elevating mechanism 207b, the carrying robot 273, the heater 206, the sub-heater 206a, the pressure regulator (APC) 262, the vacuum pump 264, the valves va1 to va5, vb1 to vb5, vc1 to vc3, vd1 and vd2, and ve1 to ve3, and the MFCs 222a, 222b, 222c, 222d, and 222e.

(2) Substrate Processing Processes

Figure 1:
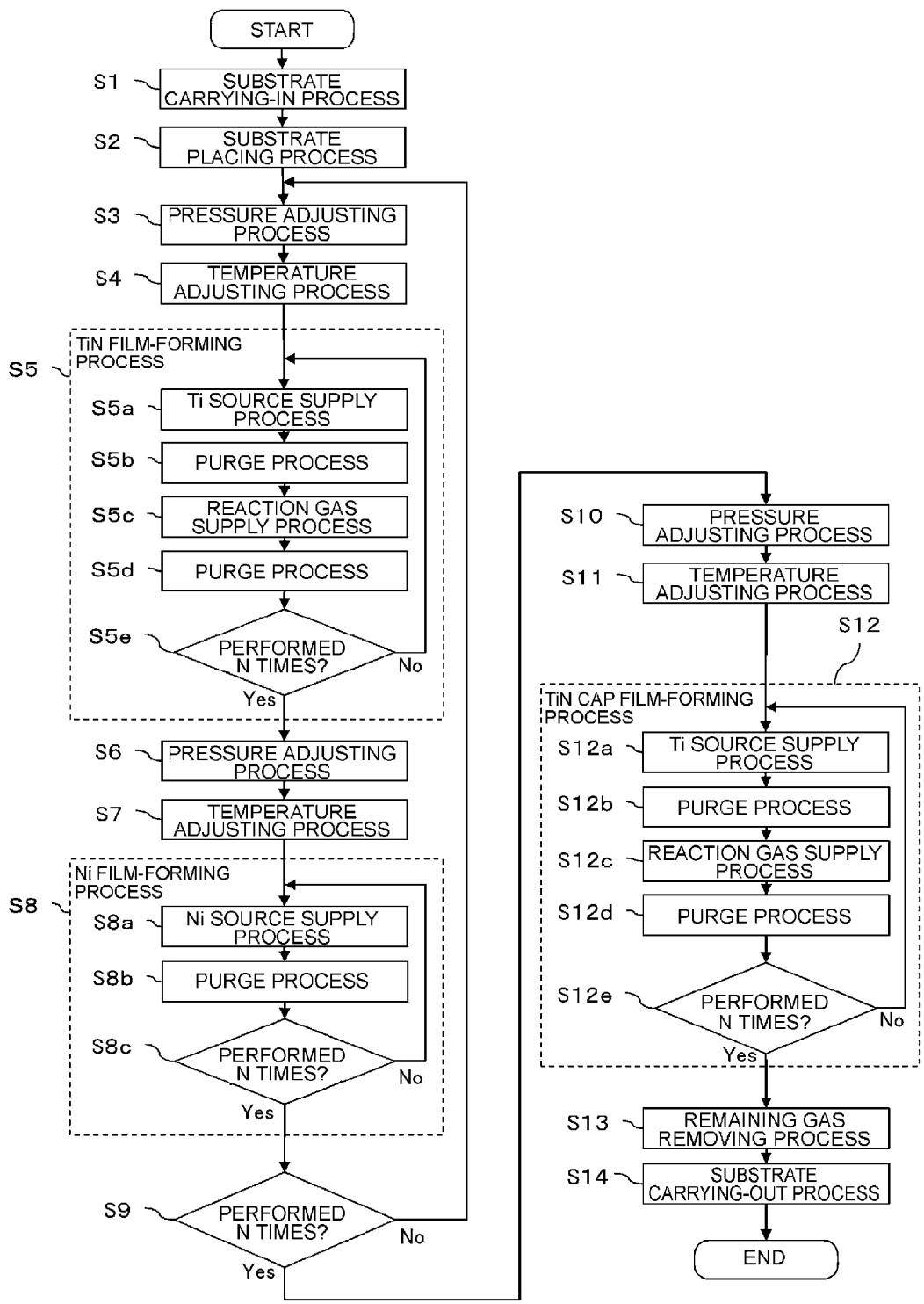
FIG. 1 is a flowchart for explaining substrate processing processes according to an embodiment of the present invention.

Next, with reference to FIG. 1, as one of semiconductor device manufacturing processes, a substrate processing process for forming a thin film on a wafer by a chemical vapor deposition (CVD) method and an atomic layer deposition (ALD) method using the above-described substrate processing apparatus will be explained according to the embodiment of the present invention. FIG. 1 is a flowchart for explaining substrate processing processes according to the embodiment of the present invention. In the following description, operations of parts constituting the substrate processing apparatus are controlled by the controller 280.

In the following description, an explanation will be given on an exemplary case where a metal film having a stacked structure constituted by a TiN film being a first metal film and a Ni film being a second metal film is formed on a $TiO_2$ film which is previously formed on a substrate such as a wafer 200 as an insulating film (gate insulating film or capacitor insulating film).

The TiN film which is a first metal film is formed according to an ALD method by alternately supplying a first source gas (Ti source), which is generated by vaporizing a first source ($TiCl_4$), and a reaction gas ($NH_3$ gas) into the process chamber 201 in which the wafer 200 is accommodated. The Ni film which is a second metal film is formed according to a CVD method by supplying a second source gas (Ni source) generated by vaporizing a second source ($Ni(PF_3)_4$) into the process chamber 201 in which the wafer 200 is accommodated. The first source gas and the reaction gas constitute a first process gas, and the second source gas constitutes a second process gas.

In this specification, the term "metal film" is used to denote a film formed of a conductive material containing metal atoms. Examples thereof include a conductive elemental metal film formed of an elemental metal, a conductive metal nitride film, a conductive metal oxide film, a conductive metal oxynitride film, a conductive metal composite film, a conductive metal alloy film, and a conductive metal silicide film. The TiN film is a conductive metal nitride film, and the Ni film is a conductive elemental metal film. The exemplary case will now be explained in detail.

<Substrate Carrying-in Process S1, Substrate Placing Process S2>

First, the elevating mechanism 207b is operated to lower the support stage 203 to the wafer carrying position as shown in FIG. 4. Next, the gate valve 251 is opened so that the process chamber 201 can communicate with the carrying chamber 271. Next, a wafer 200 to be processed is carried from the carrying chamber 271 to the process chamber 201 by using the carrying robot 273 in a state where the wafer 200 is supported on the carrying arm 273a (S1). A $TiO_2$ film is previously formed as an insulating film (gate insulating film or capacitor insulating film) on the wafer 200 to be processed. The wafer 200 loaded in the process chamber 201 is temporarily placed on the lift pins 208b which protrude upward from the top surface of the support stage 203. Thereafter, the carrying arm 273a of the carrying robot 273 is moved from the inside of the process chamber 201 back to the carrying chamber 271, and the gate valve 251 is closed.

Next, the elevating mechanism 207b is operated to raise the support stage 203 to the wafer processing position as shown in FIG. 3. As a result, the lift pins 208b are retracted from the top surface of the support stage 203, and the wafer 200 is placed on the susceptor 217 disposed at the top surface of the support stage 203 (S2).

<Pressure Adjusting Process S3, Temperature Adjusting Process S4)

Subsequently, by using the pressure regulator (APC) 262, the inside pressure of the process chamber 201 is adjusted to a predetermined process pressure (S3). In addition, power supplied to the heater 206 is controlled to increase the surface temperature of the wafer 200 to a predetermined process temperature (S4). The temperature adjusting process S4 may be performed in parallel with or prior to the pressure adjusting process S3. The predetermined process temperature and process pressure are set in a manner such that a TiN film can be formed in a TiN film-forming process S5 (described later) by an ALD method. That is, the process temperature and the process pressure are set in a manner such that a first source gas supplied in a Ti source supply process S5a does not decompose by itself.

In the substrate carrying-in process S1, the substrate placing process S2, the pressure adjusting process S3, and the temperature adjusting process S4, the vacuum pump 264 is operated in a state where the valves va3 and vb3 are closed and the valves vd1, vd2, vc3, ve1, ve2, and ve3 are opened, so as to create a flow of $N_2$ gas in the process chamber 201. By this, adhesion of particles to the wafer 200 can be suppressed.

Along with the processes S1 to S4, a first source ($TiCl_4$) is vaporized to generate a first source gas (Ti source). That is $TiCl_4$ gas is generated (preliminary vaporization). That, the valves va1, va2, and va5 are opened, and a carrier gas the flow rate of which is controlled by the MFC 222a is supplied from the first carrier gas supply pipe 237a into the first bubbler 220a so as to vaporize a first source filled in the first bubbler 220a by bubbling to generate a first source gas (preliminary vaporization process). In this preliminary vaporization process, while operating the vacuum pump 264, the valve va4 is opened in a state where the valve va3 is closed, so that the first source gas is not supplied into to the process chamber 201 but is exhausted through a route bypassing the process chamber 201. A predetermined time is necessary for the first bubbler 220a to stably generate the first source gas. For this reason, in the current embodiment, the first source gas is preliminary generated, and the flow passage of the first source gas is changed by selectively opening and closing the valves va3 and va4. That is, by selectively opening and closing the valves va3 and va4, stable supply of the first source gas into the process chamber 201 can be quickly started and stopped. This operation is preferable.

<TiN Film-Forming Process S5>

(Ti Source Supply Process S5a)

Next, while operating the vacuum pump 264, the valve va4 is closed and the valve va3 is opened to start supply of the first source gas (Ti source) into the process chamber 201.

The first source gas is distributed by the shower head 240 so that the first source gas can be uniformly supplied to the wafer 200 disposed in the process chamber 201. Surplus first source gas flows in the exhaust duct 259 and is exhausted to the exhaust outlet 260 and the exhaust pipe 261. At this time, the process temperature and process pressure are set in a manner such that the first source gas does not decompose by itself. Therefore, molecules of the first source gas are adsorbed on the $TiO_2$ film which is previously formed on the wafer 200 as an insulating film (gate insulating film or capacitor insulating film).

When the first source gas is supplied into the process chamber 201, so as to prevent permeation of the first source gas into the reaction gas supply pipe 213c and facilitate diffusion of the first source gas in the process chamber 201, it is preferable that the valves vc1, vc2, and vc3 are kept in an opened state to continuously supply $N_2$ gas into the process chamber 201.

After a predetermined time from the start of supply of the first source gas by opening the valve va3, the valve va3 is closed, and the valves va4 is opened to stop supply of the first source gas into the process chamber 201.

(Purge Process S5b)

After stopping supply of the first source gas by closing the valve va3, the valves vd1, vd2, vc3, ve1, ve2, and ve3 are opened to supply $N_2$ gas into the process chamber 201. The $N_2$ gas is dispersed by the shower head 240 and uniformly supplied to the wafer 200 disposed in the process chamber 201, and then the $N_2$ gas flows in the exhaust duct 259 and is exhausted to the exhaust outlet 260 and the exhaust pipe 261. In this way, the first source gas remaining in the process chamber 201 is removed, and the inside of the process chamber 201 is purged with $N_2$ gas.

(Reaction Gas Supply Process S5c)

After the inside of the process chamber 201 is purged, the valves vc1, vc2, and vc3 are opened to start supply of a reaction gas ($NH_3$ gas) into the process chamber 201. The reaction gas is dispersed by the shower head 240 and uniformly supplied to the wafer 200 disposed in the process chamber 201 so that the reaction gas reacts with the molecules of the first source gas adsorbed on the $TiO_2$ film previously formed on the wafer 200. Thus, a TiN film constituted by about less than one atomic layer (less than 1 Å) is formed on the $TiO_2$ film. Surplus reaction gas or reaction byproducts are allowed to flow in the exhaust duct 259 and are exhausted to the exhaust outlet 260 and the exhaust pipe 261. After a predetermined time from the start of supply of the reaction gas by opening the valve vc1, vc2, and vc3, the supply of the reducing gas into the process chamber 201 is interrupted by closing the valves vc1 and vc2.

When the reaction gas is supplied into the process chamber 201, so as to prevent permeation of the reaction gas into the first source gas supply pipe 213a and the second source gas supply pipe 213b and facilitate diffusion of the reaction gas in the process chamber 201, it is preferable that the valves ve1, ve2, and ve3 are kept opened to continue supply of $N_2$ gas into the process chamber 201.

(Purge Process S5d)

After stopping supply of the reaction gas by closing the valve vc1 and vc2, the valves vd1, vd2, vc3, ve1, ve2, and ve3 are opened to supply $N_2$ gas into the process chamber 201. The $N_2$ gas is dispersed by the shower head 240 and uniformly supplied to the wafer 200 disposed in the process chamber 201, and then the $N_2$ gas flows in the exhaust duct 259 and is exhausted to the exhaust outlet 260 and the exhaust pipe 261.

In this way, reaction gas and reaction byproducts remaining in the process chamber 201 are removed, and the inside of the process chamber 201 is purged with the $N_2$ gas.

(Predetermined-Time Executing Process S5e)

The Ti source supply process S5a, the purge process S5b, the reaction gas supply process S5c, and the purge process S5d are set as one cycle, and the cycle (ALD cycle) is performed predetermined times (n1 cycles) so that a titanium nitride (TiN) film having a predetermined thickness can be formed as a first metal film on the $TiO_2$ film previously formed on the wafer 200. The TiN film which is a first metal film has an oxidation resistance greater than that of a Ni film that will be formed as a second metal film (described later).

<Pressure Adjusting Process S6, Temperature Adjusting Process S7>

Subsequently, by using the pressure regulator (APC) 262, the inside pressure of the process chamber 201 is adjusted to a predetermined process pressure (S6). In addition, power supplied to the heater 206 is controlled to increase the surface temperature of the wafer 200 to a predetermined process temperature (S7). The temperature adjusting process S7 may be performed in parallel with or prior to the pressure adjusting process S6. The predetermined process temperature and process pressure are set in a manner such that a Ni film can be formed in a Ni film-forming process S8 (described later) by a CVD method. That is, the process temperature and the process pressure are set in a manner such that a second source gas supplied in a Ni source supply process S8a can decompose by itself.

Along with the pressure adjusting process S6 and the temperature adjusting process S7, a second source (Ni(PF$_3$)$_4$) is vaporized to previously generate a second source gas (Ni source), that is, Ni(PF$_3$)$_4$ gas for the next Ni film-forming process S8 (preliminary vaporization). That is, the valves vb1, vb2, and vb5 are opened, and a carrier gas, the flow rate of which is controlled by the MFC 222b, is supplied from the second carrier gas supply pipe 237b into the second bubbler 220b so as to vaporize a second source filled in the second bubbler 220b by bubbling to generate a second source gas (preliminary vaporization process). In this preliminary vaporizing process, while operating the vacuum pump 264, the valve vb4 is opened in a state where the vb3 is closed so as not to supply the second source gas into the process chamber 201 but exhaust the second source gas through a route bypassing the process chamber 201. A predetermined time is necessary for the second bubbler 220b to stably generate the second source gas. For this reason, in the current embodiment, the second source gas is preliminarily generated, and the flow passage of the second source gas is changed by selectively opening and closing the valves vb3 and vb4. That is, by selectively opening and closing the valves vb3 and vb4, stable supply of the second source gas into the process chamber 201 can be quickly started and stopped. This operation is preferable.

<Ni Film-Forming Process S8>

(Ni Source Supply Process S8a)

Next, while operating the vacuum pump 264, the valve va4 is closed and the valve va3 is opened to supply the second source gas (Ni source) into the process chamber 201. The second source gas is distributed by the shower head 240 so that the second source gas can be uniformly supplied to the wafer 200 disposed in the process chamber 201. Surplus second source gas flows in the exhaust duct 259 and is exhausted to the exhaust outlet 260 and the exhaust pipe 261. At this time, the process temperature and process pressure are set in a manner such that the second source gas can decompose. Therefore, the second source gas supplied to the wafer 200 thermally decomposes and participates in a CVD reaction, and accordingly a Ni film is formed on the wafer 200.

When the second source gas is supplied into the process chamber 201, so as to prevent permeation of the second source gas into the reaction gas supply pipe 213c and facilitate diffusion of the second source gas in the process chamber 201, it is preferable that the valves vd1, vd2, and vd3 are kept in an opened state to continuously supply $N_2$ gas into the process chamber 201.

After a predetermined time from the start of supply of the second source gas by opening the valve vb3, the valve vb3 is closed and the valves vb4 is opened to stop supply of the second source gas into the process chamber 201.

(Purge Process S8b)

After stopping supply of the second source gas by closing the valve vb3, the valves vd1, vd2, vc3, ve1, ve2, and ve3 are opened to supply $N_2$ gas into the process chamber 201. The $N_2$ gas is dispersed by the shower head 240 and supplied into the process chamber 201, and then the $N_2$ gas flows in the exhaust duct 259 and is exhausted to the exhaust outlet 260 and the exhaust pipe 261. In this way, the second source gas remaining in the process chamber 201 is removed, and the inside of the process chamber 201 is purged with $N_2$ gas.

(Predetermined-Time Executing Process S8c)

The Ni source supply process S8a and the purge process S8b are set as one cycle, and the cycle is performed predetermined times (n2 cycles) so that a nickel film (Ni film) having a predetermined thickness can be formed as a second metal film on the TiN film which is formed as a first metal film over the wafer 200. The Ni film which is a second metal film is made of a material having a work function greater than 4.8 eV and different from a material used to form the first metal film.

<Predetermined-Time Executing Process S9>

The pressure adjusting process S3 to the TiN film-forming process S5 and the pressure adjusting process S6 to the Ni film-forming process S8 are set as one cycle, and the cycle is performed predetermined times (n3 cycles) so that a metal film having a stacked structure constituted by the TiN film being the first metal film and the Ni film being the second metal film can be formed on the $TiO_2$ film previously formed on the wafer 200. As described above, the TiN film which is the first metal film has an oxidation resistance greater than the oxidation resistance of the Ni film which is the second metal film. In addition, the Ni film which is the second metal film is made of a material having a work function greater than 4.8 eV and being different from the first metal film. The TiN film which is the first metal film is formed between the Ni film (second metal film) and the $TiO_2$ film.

<Pressure Adjusting Process S10, Temperature Adjusting Process S11>

Next, like in the pressure adjusting process S3 and the temperature adjusting process S4, the inside pressure of the process chamber 201 is adjusted to a predetermined process pressure (S10), and the surface temperature of the wafer 200 is adjusted to a predetermined process temperature (S11).

<TiN Cap Forming Process S12>

(Ti Source Supply Process S12a)

Next, like in the Ti source supply process S5a, the first source gas (Ti source) is supplied into the process chamber 201 for a predetermined time, and then the supply of the first source gas into the process chamber 201 is stopped.

(Purge Process S12b)

After stopping the supply of first source gas, the inside of the process chamber 201 is purged with $N_2$ gas like in the purge process S5b.

(Reaction Gas Supply Process S12c)

After the inside of the process chamber 201 is purged, like in the reaction gas supply process S5c, the reaction gas ($NH_3$ gas) is supplied into the process chamber 201 for a predetermined time, and then the supply of the reaction gas into the process chamber 201 is stopped.

(Purge Process S12d)

After stopping the supply of the reaction gas, the inside of the process chamber 201 is purged with $N_2$ gas like in the purge process S5d.

(Predetermined-Time Executing Process S12e)

The Ti source supply process S12a, the purge process S12b, the reaction gas supply process S12c, and the purge process S12d are set as one cycle, and the cycle is performed predetermined times (n4 cycles) so that a TiN film (TiN cap film) having a predetermined thickness can be formed as a first metal film on the metal film (having a stacked structure constituted by TiN film and Ni film) formed through the predetermined-time executing process S9.

Figure 6B:
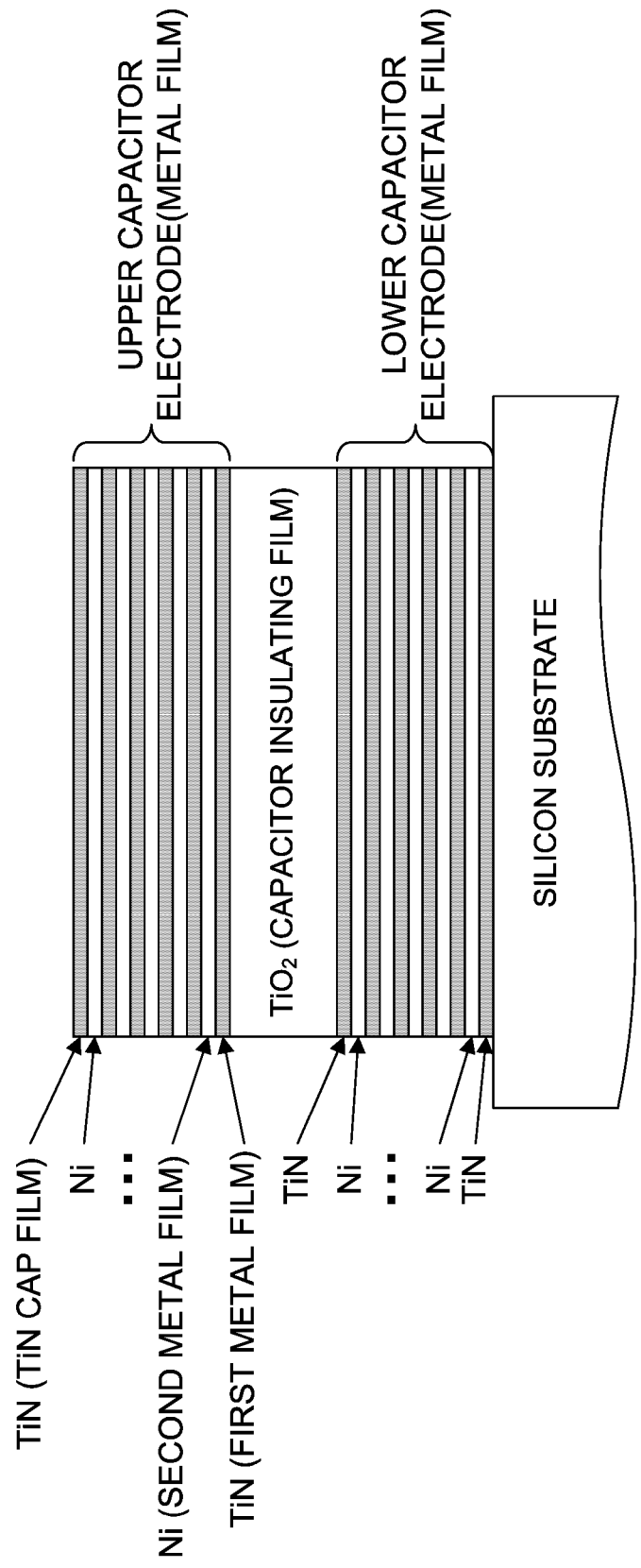
FIG. 6B is sectional view illustrating a capacitor electrode formed by performing the TiN film-forming process and the Ni film-forming process a plurality of times.

By performing the processes S3 to S12, the metal film can be formed adjacent to the $TiO_2$ film which is previously formed on the wafer 200 as an insulating film (gate insulating film or capacitor insulating film). The metal film has a stacked structure constituted by the TiN film which is the first metal film and the Ni film which is the second metal film. The first metal film is made of a material (TiN) having an oxidation resistance greater than the oxidation resistance of the second metal film, and the second metal film is made of a material (Ni) having a work function greater than 4.8 eV and being different from the material used to make the first metal film. In addition, the TiN film is formed between the Ni film and the $TiO_2$ film. Furthermore, the TiN film (TiN cap film) is formed on the outermost surface of the metal film. If the execution number (n3 cycles) of the predetermined-time executing process S9 is set to one (one cycle), a metal film can be formed as a gate electrode as shown in FIG. 5A or a top capacitor electrode as shown in FIG. 6A. If the execution number (n3 cycles) of the predetermined-time executing process S9 is set to two or more (two or more cycles), a metal film can be formed as a gate electrode as shown in FIG. 5B or a top capacitor electrode as shown in FIG. 6B. A bottom capacitor electrode as shown in FIG. 6B may also be formed through a process similar to the process of forming the top capacitor electrode.

<Remaining Gas Removing Process S13>

After the TiN cap film having a predetermined thickness is formed on the metal film (having a stacked structure constituted by TiN film and Ni film) formed through the predetermined-time executing process S9, the inside of the process chamber 201 is vacuum-evacuated, and the valves vd1, vd2, vc3, ve1, ve2, and ve3 are opened to supply $N_2$ gas into the process chamber 201. The $N_2$ gas is dispersed by the shower head 240 and supplied into the process chamber 201, and then the $N_2$ is exhausted to the exhaust pipe 261. In this way, gas and reaction byproducts remaining in the process chamber 201 are removed, and the inside of the process chamber 201 is purged with the $N_2$ gas.

<Substrate Carrying-Out Process S14>

Thereafter, in the reverse order to that of the substrate carrying-in process S1 and the substrate placing process S2, the wafer 200, over which the metal film (having a stacked structure constituted by TiN film and Ni film) and the TiN cap film are formed to predetermined thicknesses, is carried out from the process chamber 201 to the carrying chamber 271, thereby completing the substrate processing process of the current embodiment.

Furthermore, in the current embodiment, the TiN film-forming process S5 may be performed to a wafer 200 under the following exemplary conditions.

Process temperature: 250° C. to 550° C., preferably, 350° C. to 550° C.,

Process pressure: 50 Pa to 5,000 Pa,

Supply flow rate of carrier gas ($N_2$) for bubbling: 10 sccm to 1,000 sccm,

Supply flow rate of first source gas ($TiCl_4$): 0.1 sccm to 2 sccm,

Supply flow rate of reaction gas ($NH_3$): 10 sccm to 1,000 sccm,

Supply flow rate of purge gas ($N_2$): 100 sccm to 10,000 sccm, and

Film thickness (TiN film): 0.2 nm to 4 nm.

Furthermore, in the current embodiment, the Ni film-forming process S8 may be performed to a wafer 200 under the following exemplary conditions.

Process temperature: 150° C. to 250° C., preferably, 150° C. to 200° C.,

Process pressure: 50 Pa to 5,000 Pa,

Supply flow rate of carrier gas ($N_2$) for bubbling: 10 sccm to 1,000 sccm,

Supply flow rate of second source gas ($Ni(PF_3)_4$): 0.1 sccm to 2 sccm,

Supply flow rate of purge gas ($N_2$): 100 sccm to 10,000 sccm, and

Film thickness (Ni film): 0.5 nm to 10 nm, preferably, 4 nm to 5 nm.

In addition, total film thickness in the predetermined-time executing process S9, that is, the thickness of a metal film having a stacked structure constituted by TiN film being first metal film and Ni film being second metal film may be, for example, 10 nm to 30 nm.

Furthermore, in the current embodiment, the TiN cap film-forming process S12 may be performed to a wafer 200 under the following exemplary conditions.

Process temperature: 250° C. to 550° C., preferably, 350° C. to 550° C.,

Process pressure: 50 Pa to 5,000 Pa,

Supply flow rate of carrier gas ($N_2$) for bubbling: 10 sccm to 1,000 sccm,

Supply flow rate of first source gas ($TiCl_4$): 0.1 sccm to 2 sccm,

Supply flow rate of reaction gas (NH$_3$): 10 sccm to 1,000 sccm,

Supply flow rate of purge gas (N$_2$): 100 sccm to 10,000 sccm, and

Film thickness (TiN film): 0.2 nm to 50 nm, preferably, 1 nm to 10 nm.

If a TiN film is formed to have a thickness of less than 0.2 nm in the TiN film-forming process S5, the TiN film may not be constituted by one or more continuous layers between a Ni film and a TiO$_2$ film. That is, the TiN film may be constituted by a discontinuous layer, and thus the Ni film and the TiO$_2$ may make contact with each other. Therefore, an oxygen component included in the TiO$_2$ film may permeate into the Ni film through a contact part, and thus the Ni film may be oxidized. In addition, if a TiN film is formed to have a thickness greater than 4 nm in the TiN film-forming process S5, the effective work function of an entire metal film may not be the work function of a Ni film (about 5.15 eV) but may be close to the work function of the TiN film (about 4.6 eV). Thereafter, it is preferable that a TiN film is formed to have a thickness of 0.2 nm to 4 nm in the TiN film-forming process S5.

In addition, if the process temperature of the Ni film-forming process S8 is lower than 150° C., in the Ni film-forming process S8a, the second source (Ni(PF$_3$)$_4$) may not decompose by itself, and thus, a CVD film-forming reaction may not occur. In addition, if the process temperature is higher than 250° C. in a state where the process pressure is kept in the above-mentioned range, the film-forming rate may increase excessively, and thus it may be difficult to control a film thickness. Therefore, in the Ni film-forming process S8, it is necessary to keep the process temperature in the range from 150° C. to 250° C. for inducing a CVD film-forming reaction and controlling a film thickness.

In the current embodiment, it is preferable that the TiN film-forming process S5 and the Ni film-forming process S8 are performed at the same process temperature and/or the same process pressure. That is, in the current embodiment, it is preferable that the TiN film-forming process S5 and the Ni film-forming process S8 are performed at a constant process temperature and/or a constant process pressure. If the process temperature and the process pressure are set to predetermined values in the above-mentioned ranges, ALD film formation and CVD film formation can be performed under the same conditions. In this case, when the procedure goes from the TiN film-forming process S5 to the Ni film-forming process S8 or from the Ni film-forming process S8 to the TiN film-forming process S5, a process of changing the process temperature and a process of changing the process pressure may not be necessary, and thus the throughput may be improved.

(3) Effects of the Embodiment

According to the current embodiment, one or more of the following effects can be obtained.

(a) According to the current embodiment, the TiN film having an oxidation resistance greater than that of the Ni film is formed as the lowermost layer of the metal film, that is, the layer (interfacial surface) between the Ni film and the TiO$_2$ film. Since the TiN film has an oxidation resistance greater than that of the Ni film, for example, when the Ni film is formed by a CVD method or the wafer 200 on which the metal film is formed is heated to about 400° C. to perform an annealing treatment, it can be prevented that the Ni film is oxidized by an oxygen component permeated from the TiO$_2$ film into the Ni film through an interfacial surface therebetween. Particularly, in the current embodiment, the TiN film is formed to have a thickness of 0.2 nm or greater in the TiN film-forming process S5. Thus, the TiN film formed between the Ni film and the TiO$_2$ film can be surely constituted by one or more continuous layers, and thus the Ni film and the TiO$_2$ film can be prevented from directly making contact with each other and oxidation of the Ni film can be effectively suppressed. Hence, oxidation of the metal film can be suppressed, and an increase of equivalent oxide thickness (EOT) can be prevented.

(b) In addition, according to the current embodiment, the TiN film (TiN cap layer) having an oxidation resistance greater than that of the Ni film is formed as the uppermost layer of the metal film, that is, the exposed surface layer of the metal film. Thus, permeation of oxygen from the atmosphere to the Ni film through the exposed surface of the metal film can be prevented, and thus oxidation of the Ni film can be suppressed. For example, when the wafer 200 on which the metal film is exposed is carried for the next process, it can be prevented that the Ni film is oxidized at room temperature by oxygen permeated into the Ni film from the atmosphere through the exposed surface of the metal film. Particularly, according to the current embodiment, in the TiN cap forming process S12, the TiN film is formed to have a thickness of 0.2 nm to 50 nm, preferably, 1 nm to 10 nm, and thus the TiN film covering the surface of the Ni film can be surely constituted by one or more continuously layers. Therefore, the Ni film can be prevented from making direct contact with the atmosphere, and thus oxidation of the Ni film can be effectively suppressed. Hence, oxidation of the metal film can be suppressed, and an increase of EOT can be prevented.

(c) In addition, according to the current embodiment, the second metal film is formed of Ni (different from the first metal film in material) having a work function greater than 4.8 eV. Although the work function of TiN used to form the first metal film is estimated to be 4.6 eV, the work function of Ni is 5.15 eV as shown in FIG. 10. Thus, the effective work function of the entire metal film having a stacked structure constituted by the TiN film and the Ni film can be close to the work function of the Ni film (about 5.15 eV). Particularly, according to the current embodiment, the thickness of the Ni film formed in the Ni film-forming process S8 is greater than the thickness of the TiN film formed in the TiN film-forming process S5. Thus, the effect of the work function of the thicker Ni film is increased, and thus the effective work function of the entire work function of the metal film having a stacked structure constituted by the TiN film and the Ni film can be closer to the work function of the Ni film (about 5.15 eV). Therefore, when the metal film is used as a capacitor electrode, a leak current of a capacitor part can be reduced.

For example, if a metal film as shown in FIG. 5A or FIG. 6A is formed by performing the TiN film-forming process S5 and the Ni film-forming process S8 once in a manner such that a TiN film is formed to have a thickness ranging from 0.2 nm to 4 nm in the TiN film-forming process S5 and a thicker Ni film is formed to have a thickness ranging from 0.5 nm to 10 nm, preferably, 4 nm to 5 nm in the Ni film-forming process S8, the effect of the work function of the thicker Ni film is high so that the effective work function of the entire metal film can approach about 5.0 eV. For example, when a metal film as shown in FIG. 5B or FIG. 6B is formed by setting the TiN film-forming process S5 and the Ni film-forming process S8 as one cycle and performing the cycle a plurality of times, the effective work function of the entire metal film can be adjusted to a desired value. That is, in this case, since the work functions of TiN films and Ni films are affected by each other, the effective work function of the entire metal film can be adjusted to a desired value between 4.6 eV and 5.0 eV by adjusting a thickness ratio of the TiN films and the Ni films. In either case, if the thickness of the TiN film formed in the TiN film-forming process S5 is greater than 4 nm, the effective work function of the entire metal film may be decreased to be close to the work function (4.6 eV) of the TiN film.

FIG. 7 is a schematic view illustrating the energy level of a conventional capacitor electrode constituted by a single layer of TiN film. The leak current of a capacitor structure (metal-insulator-metal (MIM) structure), in which a capacitor insulating film (for example, a $TiO_2$ film) is disposed between TiN films, is determined mainly by the work function of capacitor electrodes and the band offset (conduction band offset) of the conduction band side of the capacitor insulating film. Since a voltage of ±1 V is generally applied between capacitor electrodes, it is preferable that a conduction band offset is greater than 1.0 eV. In addition, since the work function of TiN is about 4.6 eV, if a $TiO_2$ film is used as a capacitor insulating film, a conduction band offset of only about 1.0 eV may be ensured, and thus leak current may be increased.

Figure 8:
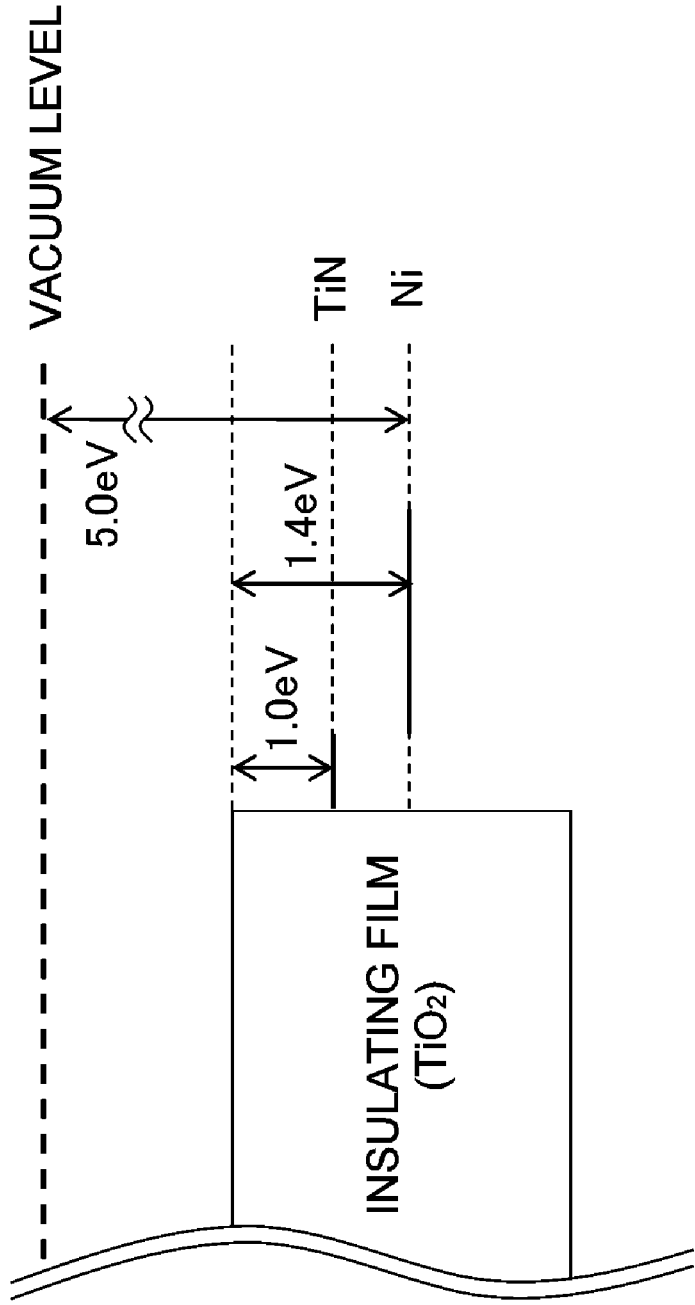
FIG. 8 is a schematic view illustrating the energy levels of a metal film formed by performing a TiN film-forming process and a Ni film-forming process once.
Figure 9:
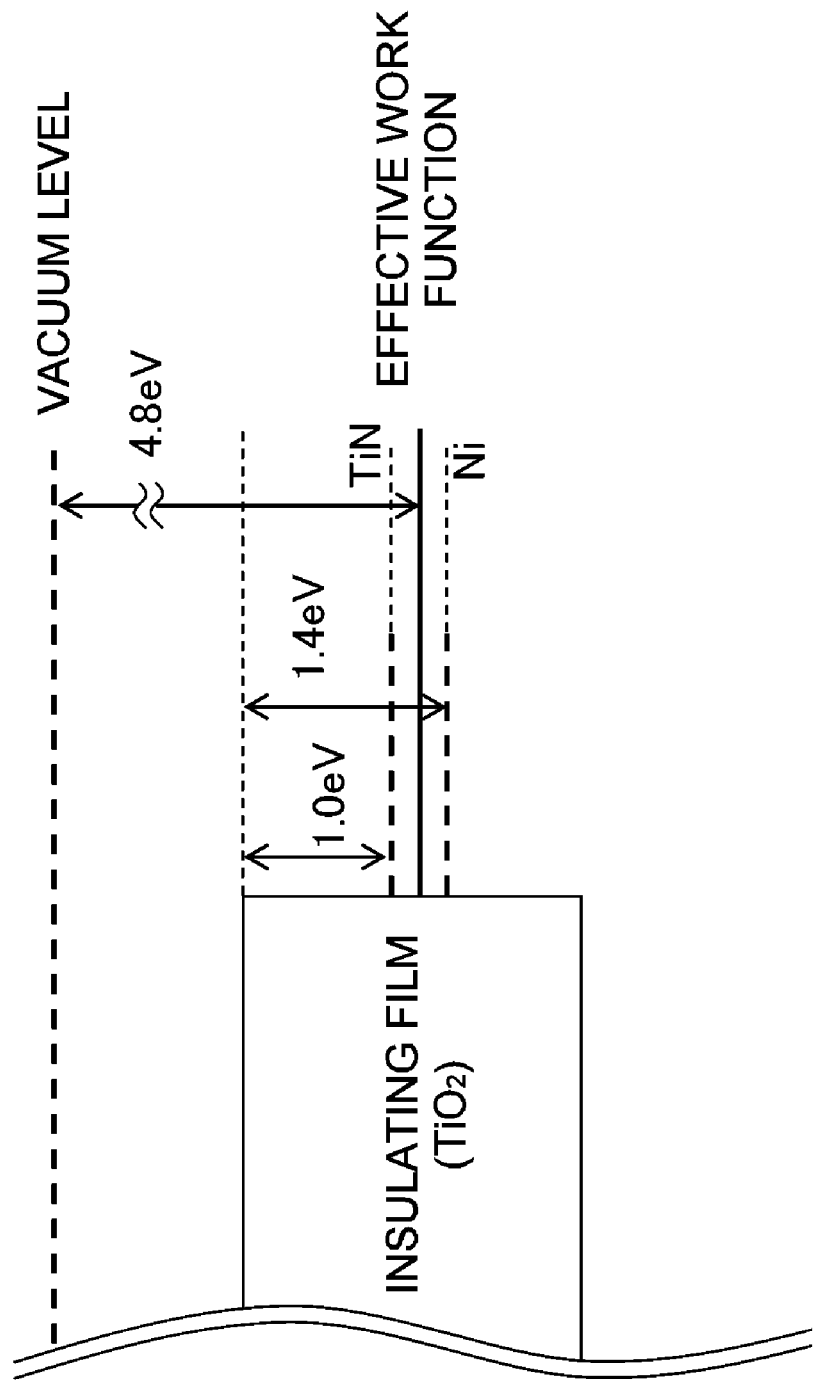
FIG. 9 is a schematic view illustrating the energy levels of a metal film formed by setting a TiN film-forming process and a Ni film-forming process as one cycle and performing the cycle a plurality of times.

However, if the metal film of the current embodiment is used as a capacitor electrode, the leak current of an MIM structure can be largely reduced. FIG. 8 is a schematic view illustrating the energy levels of a metal film formed by performing the TiN film-forming process S5 and the Ni film-forming process S8 once. In this case, as described above, the work function of the metal film having a structure in which a TiN film and a Ni film are stacked can approach almost the same level (for example, 5.0 eV) as the work function of the Ni film (about 5.15 eV). Therefore, if a $TiO_2$ film is used as an insulating film, a conduction band offset of about 1.4 eV can be ensured, and thus leak current can be largely reduced. In addition, FIG. 9 is a schematic view illustrating the energy levels of a metal film formed by setting the TiN film-forming process S5 and the Ni film-forming process S8 as one cycle and performing the cycle a plurality of times. In this case, as described above, the work function of the metal film having a structure in which TiN films and Ni films are stacked can be adjusted to a desired value (for example, 4.8 eV) in the range of, for example, 4.6 eV to 5.0 eV. Therefore, if a $TiO_2$ film is used as an insulating film, a conduction band offset can be set to a desired value (for example, 1.2 eV) in the range of 1.0 eV to 1.4 eV, and thus leak current can be effectively reduced.

(d) In addition, according to the current embodiment, a second metal film having a work function greater than 4.8 eV is formed by using a Ni film which is a metal film (non-noble metal film), instead of using an expensive noble metal film such as an Au, Ag, Pt, Pd, Rh, Ir, Ru, or Os film. In this way, manufacturing costs of semiconductor devices can be reduced.

(e) In addition, according to the current embodiment, in a metal film having a stacked structure of a TiN film and a Ni film, the Ni film is formed by a CVD method. Therefore, the total film-forming rate of the metal film can be increased as compared with the case of using only an ALD method, and the throughput can be improved.

Other Embodiments of the Present Invention

In the above-described embodiment, a liquid source filled in the bubbler is vaporized by bubbling. However, the present invention is not limited thereto. For example, the liquid source may be vaporized by using a vaporizer instead of using the bubbler.

Furthermore, in the above-described embodiment, $TiCl_4$ is used as a Ti source in the TiN film-forming process S5. However, the present invention is not limited thereto. For example, a Ti source such as TDMAT (tetrakis(dimethylamino)titanium: $Ti[N(CH_3)_2]_4$) may be used instead of $TiCl_4$.

Furthermore, in the above-described embodiment, a $TiO_2$ film having a high permittivity is used as an insulating film. However, the present invention is not limited thereto. For example, the present invention can be applied to the case of using another insulating film or a high permittivity insulating film such as a hafnium oxide ($HfO_2$) film, a zirconium oxide ($ZrO_2$) film, a niobium oxide ($Nb_2O_5$) film, a tantalum oxide ($Ta_2O_5$) film, a hafnium oxide film doped with aluminum (HfAlO film), a zirconium oxide film doped with aluminum (ZrAlO film), a strontium titanate (SrTiO) film, a barium strontium titanate (BaSrTiO) film, and a lead zirconate titanate (PZT) film.

Furthermore, in the above-described embodiment, a TiN film is used as a first metal film. However, the present invention is not limited thereto. For example, the present invention can be properly applied to the case where another film, such as a tantalum nitride (TaN) film, a titanium aluminum nitride (TiAlN) film, or tantalum aluminum nitride (TaAlN) film, is used as a first metal film. All the TaN film, the TiAlN film, and the TaAlN film have an oxidation resistance greater than that of a second metal film (Ni film). Furthermore, all the TaN film, the TiAlN film, and the TaAlN film have an oxidation resistance greater than that of a TiN film and can be usefully used as an oxidation barrier film. The TaN film is a conductive metal nitride film, the TiAlN film is a conductive composite metal film and the TaAlN film is a conductive composite metal film.

Furthermore, in the above-described embodiment, a Ni film is used as a second metal film. However, the present invention is not limited thereto. For example, the present invention can be properly applied to the case where a non-noble metal film having a work function greater than 4.8 eV, such as a beryllium (Be) film, a carbon (C) film, a cobalt (Co), a selenium (Se) film, a tellurium (Te) film, or a rhenium (Re) film, is used as a second metal film. All the listed films are conductive elemental metal films. FIG. 10 is a table illustrating a group of metals having work functions higher than 4.8 eV which can be used for forming a second metal film.

EXAMPLES

Hereinafter, examples 1 and 2 of the present invention will be described together with a conventional example and a comparative example with reference to FIG. 12 to FIG. 16.

Example 1

Figure 12:
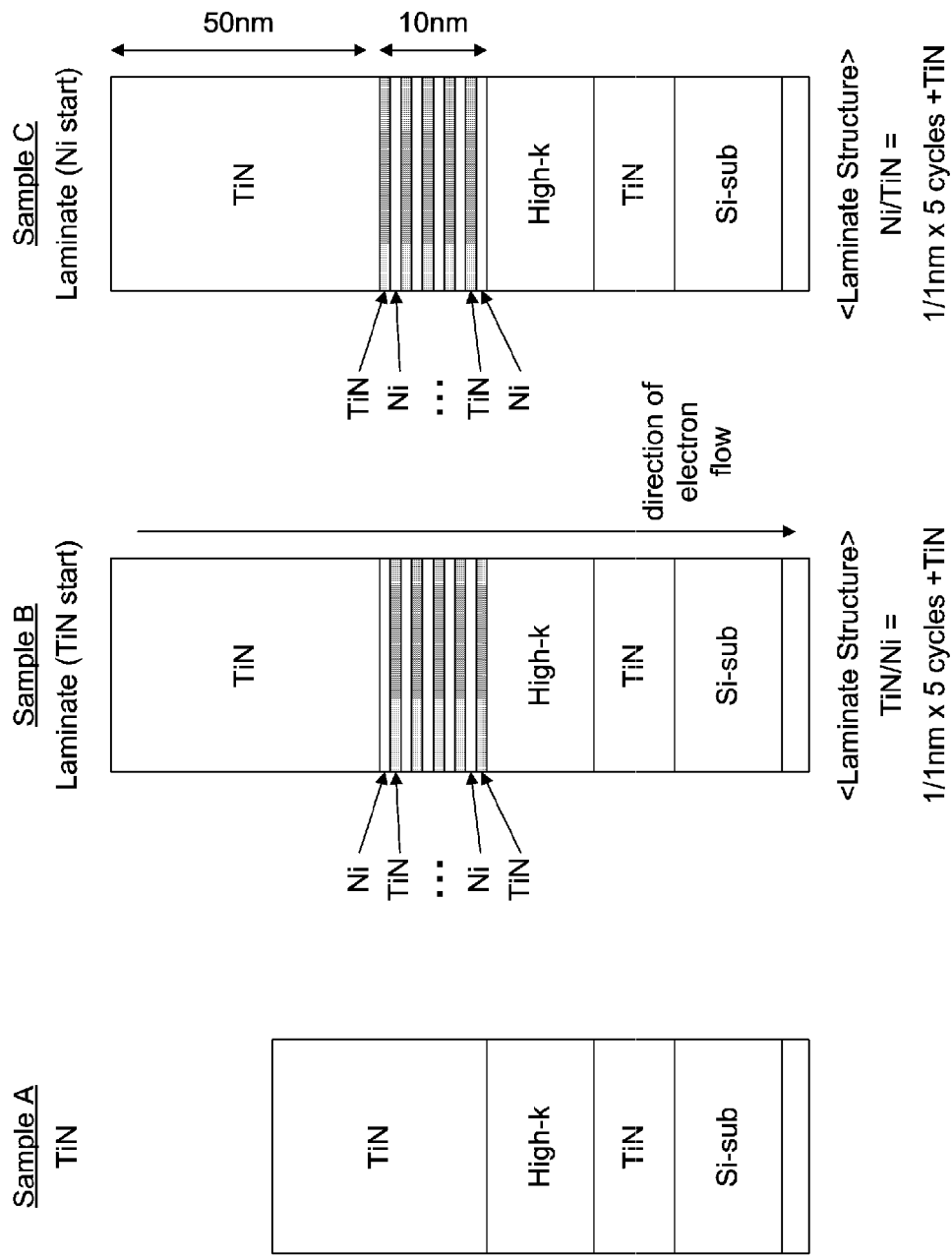
FIG. 12 is a schematic view for explaining the stacked structure of the example 1 (sample B) of the present invention together with the stacked structure of a conventional example (sample A) and the stacked structure of the comparative example (sample C).

FIG. 12 is a schematic view for explaining a stacked structure of the example 1 (sample B) of the present invention together with a stacked structure of the conventional example (sample A) and a stacked structure of the comparative example (sample C).

Figure 11:
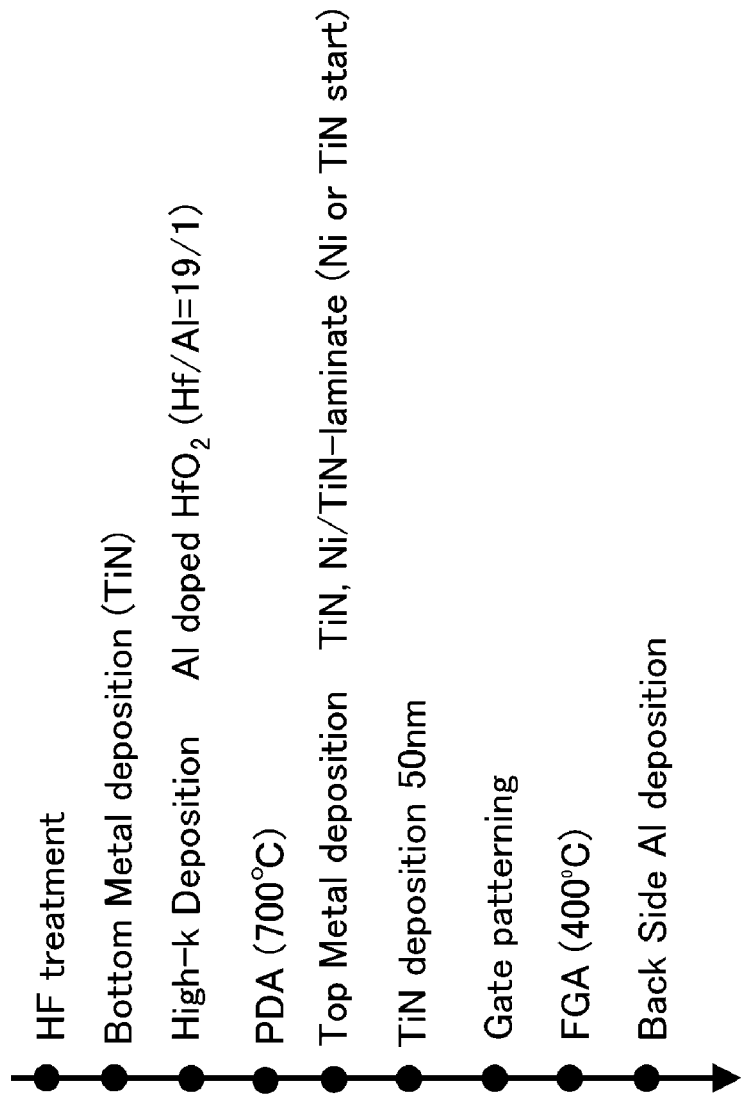
FIG. 11 is a flowchart for explaining processes of forming an example 1 (sample B) and a comparative example (sample C) illustrated in FIG. 12.

In addition, FIG. 11 is a flowchart for explaining processes of forming the sample A (conventional example), the sample B (example 1), and the sample C (comparative example) that are illustrated in FIG. 12.

As shown in FIG. 11, to make the sample B (example 1), first, a surface treatment (cleaning) was performed to a silicon substrate (Si-sub) by using hydrogen fluoride (HF) (HF treatment). Next, a TiN film was formed on the silicon substrate as a bottom electrode (bottom metal deposition). Next, a HfO$_2$ film doped with Al (HfAlO film) was formed on the TiN film as a capacitor insulating film (High-k film) (high-k deposition). Here, the ratio of Hf and Al included in the capacitor insulating film was set to be 19:1. Then, a post deposition annealing (PDA) was performed at 700° C., and then a process similar to the predetermined-time executing process S9 of the above-described embodiment was performed by using the substrate processing apparatus of the above-described embodiment so as to form a stacked structure (Ni/TiN-laminate structure) in which a plurality of TiN films and a plurality of Ni films were alternately stacked (top metal deposition). In the case of the sample B, the TiN film was first formed when forming the stacked structure (TiN start), and the stacked structure was formed in a manner such that the TiN film was formed between the Ni film and the HfAlO film. Here, the thicknesses of the TiN film and the Ni film were set to 1 nm, respectively, and the execution number of the predetermined-time executing process S9 was set to five so that the thickness of the stacked structure can be 10 nm. Then, a process similar to the TiN cap film-forming process S12 of the above-described embodiment was performed to form a TiN film (TiN cap film) having a thickness of 50 nm on the stacked structure of the TiN films and the Ni films (TiN deposition). In this way, a metal film (a stacked film constituted by the stacked structure of the TiN films and the Ni films, and the TiN cap film formed on the stacked structure) was formed as a top electrode. Then, a gate structure was patterned by photolithography (gate patterning), and after a forming gas annealing (FGA) treatment was performed at 400° C., an Al film was formed on the backside of the silicon substrate (backside Al deposition).

The sample C (comparative example) was prepared by forming a stacked structure (Ni/TiN-laminate structure) in which Ni films and TiN films were alternately stacked on a capacitor insulating film (top metal deposition). In the case of the sample C, the Ni film was first formed when forming the stacked structure (Ni start), and the stacked structure was formed in a manner such that the Ni film made direct contact with a HfAlO film. Other film-forming flows and conditions were set to be equal to those of the sample B.

The sample A (conventional example) was prepared by forming a one-layer TiN film on a capacitor insulating film as a top electrode (TiN), instead of forming a stacked structure (Ni/TiN-laminate structure) in which Ni films and TiN films were alternately stacked on the capacitor insulating film. Furthermore, in the sample A, a TiN cap film having a thickness of 50 nm was not formed. Other film-forming flows and conditions were set to be equal to those of the sample B.

Figure 13:
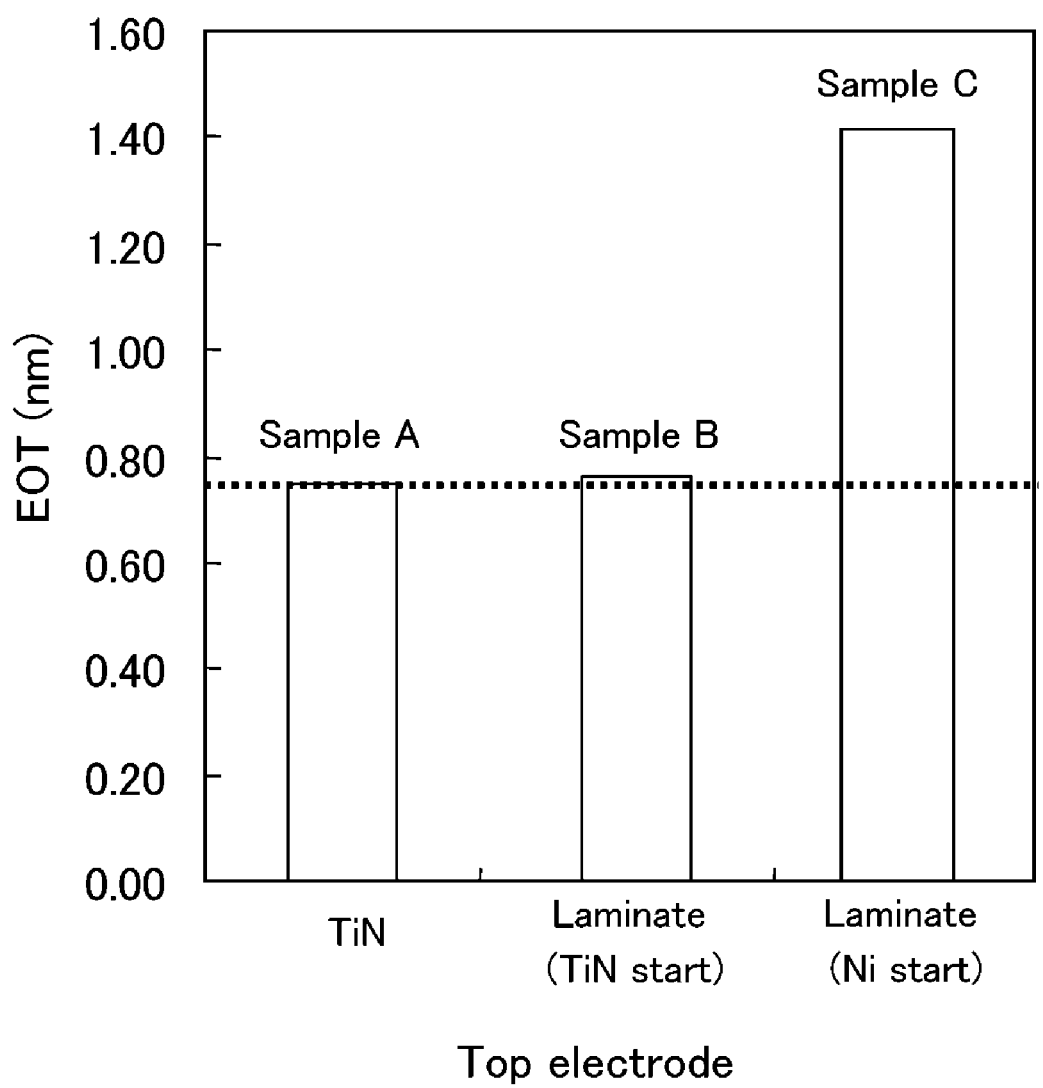
FIG. 13 is a graph illustrating the equivalent oxide thicknesses (EOTs) of the samples A, B, and C illustrated in FIG. 12.

FIG. 13 is a graph illustrating the equivalent oxide thicknesses (EOTs) of the sample A (conventional example), the sample B (example 1), and the sample C (comparative example) illustrated in FIG. 12. In FIG. 13, the vertical axis denotes EOT (nm), and the horizontal axis denotes the samples. Referring to FIG. 13, the EOT of the sample B (example 1) is 0.80 nm or less, which is almost not increased as compared with the EOT of the sample A (conventional example) in which a single layer of TiN having a high oxidation resistance is formed. However, the EOT of the sample C (comparative example), in which the stacked structure is formed in a manner such that a Ni film makes direct contact with the HfAlO film, is increased to 1.40 nm. This may be because the Ni film is oxidized by an oxygen component included in the HfAlO film. That is, like in the case of the sample B, if formation of a stacked structure is started from formation of a TiN film (TiN start) to dispose the TiN film between a Ni film and a HfAlO film, oxidation of the Ni film can be effectively suppressed.

Figure 14:
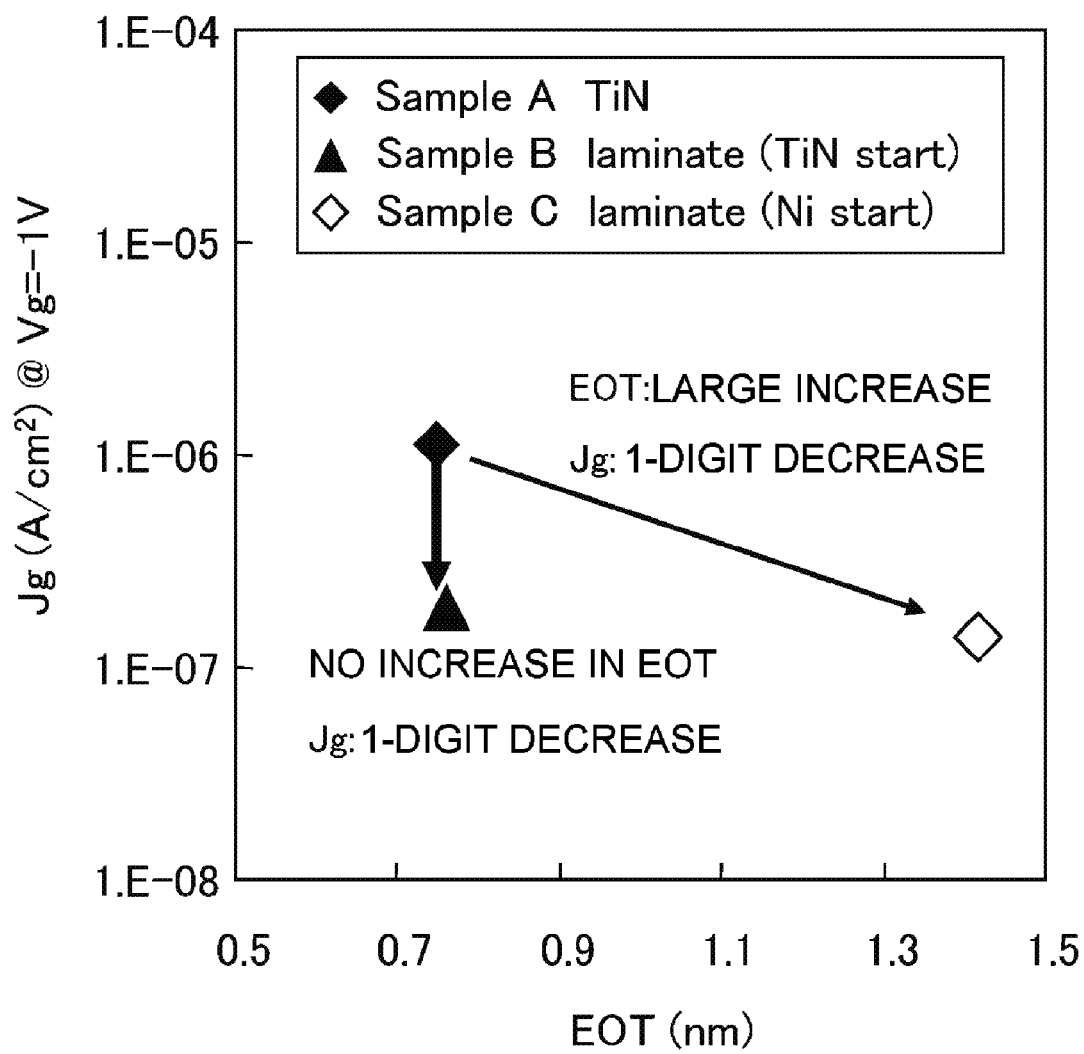
FIG. 14 is a graph illustrating relationships between leak current densities and EOTs of the respective samples A, B, and C illustrated in FIG. 12.

FIG. 14 is a graph illustrating relationships between leak current densities (Jg) and EOTs of the sample A (conventional example), the sample B (example 1), and the sample C (comparative example) illustrated in FIG. 12. In FIG. 14, the vertical axis denotes leak current density (Jg, A/cm$^2$) when a voltage of −1 V is applied between top and bottom electrodes, and the horizontal axis denotes EOT (nm). Furthermore, in FIG. 14, the symbol ◆ denotes the sample A (conventional example), the symbol ▲ denotes the sample B (example 1), and the symbol ◇ denotes the sample C (comparative example). Referring to FIG. 14, as compared with the sample A (symbol ◆), the EOT of the sample B (symbol ▲) is almost not increased and the leak current density (Jg) of the sample B is decreased by one digit. In addition, as compared with the sample A (symbol ◆), the leak current density (Jg) of the sample C (symbol ◇) is decreased by one digit, but the EOT of the sample C (symbol ◇) is largely increased. That is, like in the case of the sample B, if a TiN film is disposed between a Ni film and a HfAlO film, an increase of EOT can be suppressed, and along with this, leak current can be decreased.

Figure 15:
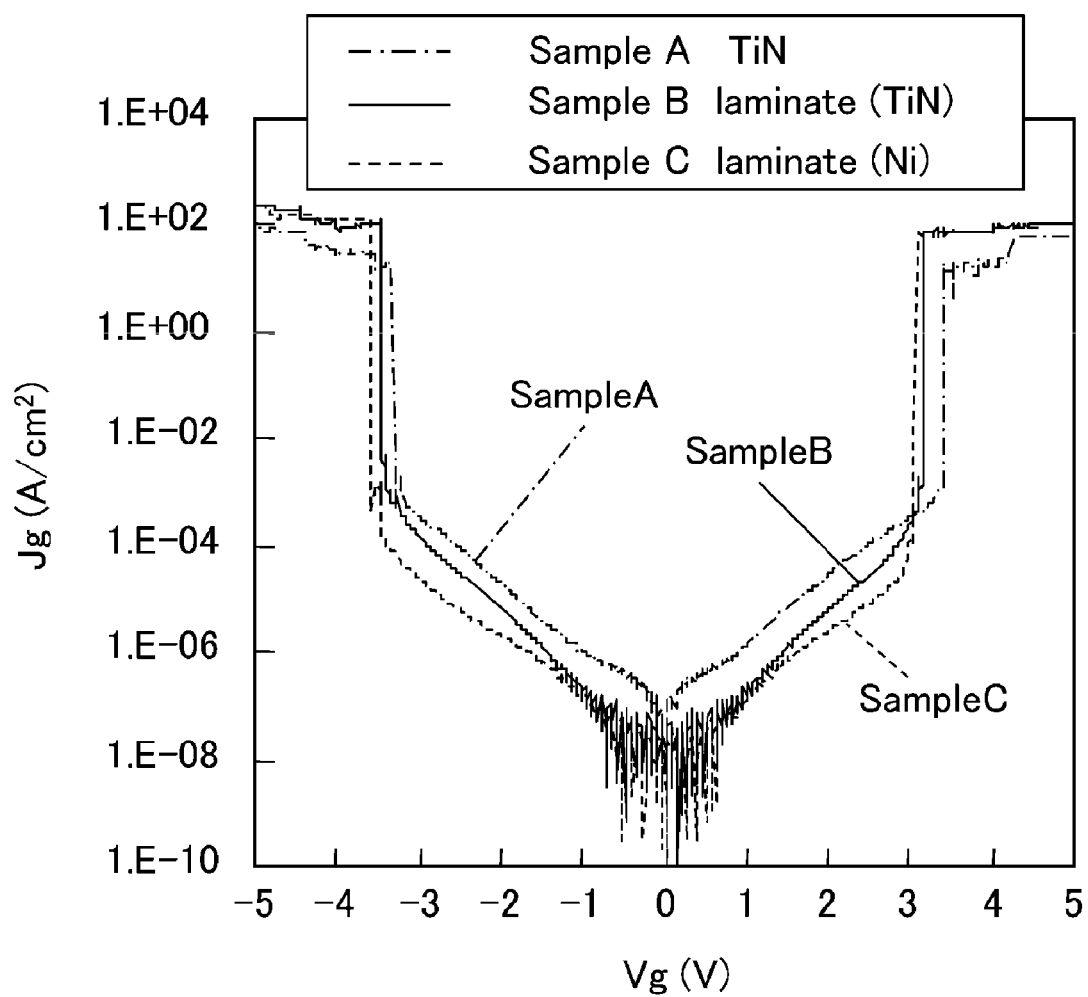
FIG. 15 is a graph illustrating relationships between leak current densities and applied voltages of the respective samples A, B, and C illustrated in FIG. 12.

FIG. 15 is a graph illustrating relationships between leak current densities (Jg) and applied voltages of the sample A (conventional example), the sample B (example 1), and the sample C (comparative example) illustrated in FIG. 12. In FIG. 15, the vertical axis denotes leak current density (Jg, A/cm$^2$), and the horizontal axis denotes voltage applied between top and bottom electrodes. Furthermore, in FIG. 15, the dashed-dotted line denotes the sample A (conventional example), the solid line denotes the sample B (example 1), and the dashed line denotes the sample C (comparative example). Referring to FIG. 15, in a general range (±1 V) of voltage applied between capacitor electrodes, the leak current densities (Jg) of the sample B (solid line) and the sample C (dashed line) are smaller than the leak current density (Jg) of the sample A (convention example). That is, like in the case of the sample B, if a stacked structure of TiN films and Ni films is formed, leak current can be decreased.

Example 2

Figure 16A:
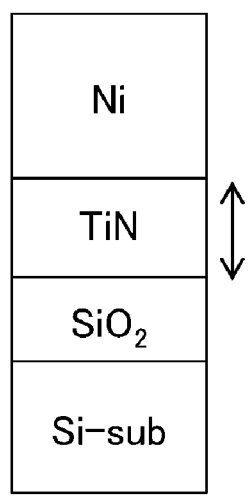
FIG. 16A is a schematic view illustrating the stacked structure of an example 2 (sample D) of the present invention.

FIG. 16A is a schematic view illustrating the stacked structure of an example 2 (sample D) of the present invention. In the sample D, a metal film was formed as a gate electrode by stacking a one-layer TiN film and a one-layer Ni film on a SiO$_2$ film functioning as a gate insulating film. The TiN film was formed to be disposed between the Ni film and the SiO$_2$ film. In addition, while varying the thickness of the TiN film to 0.2 nm, 1 nm, 2 nm, 3 nm, 4 nm, 5 nm, and 10 nm, a plurality of samples having different thickness TiN films were prepared. The thickness of the Ni film was set to 20 nm.

Figure 16B:
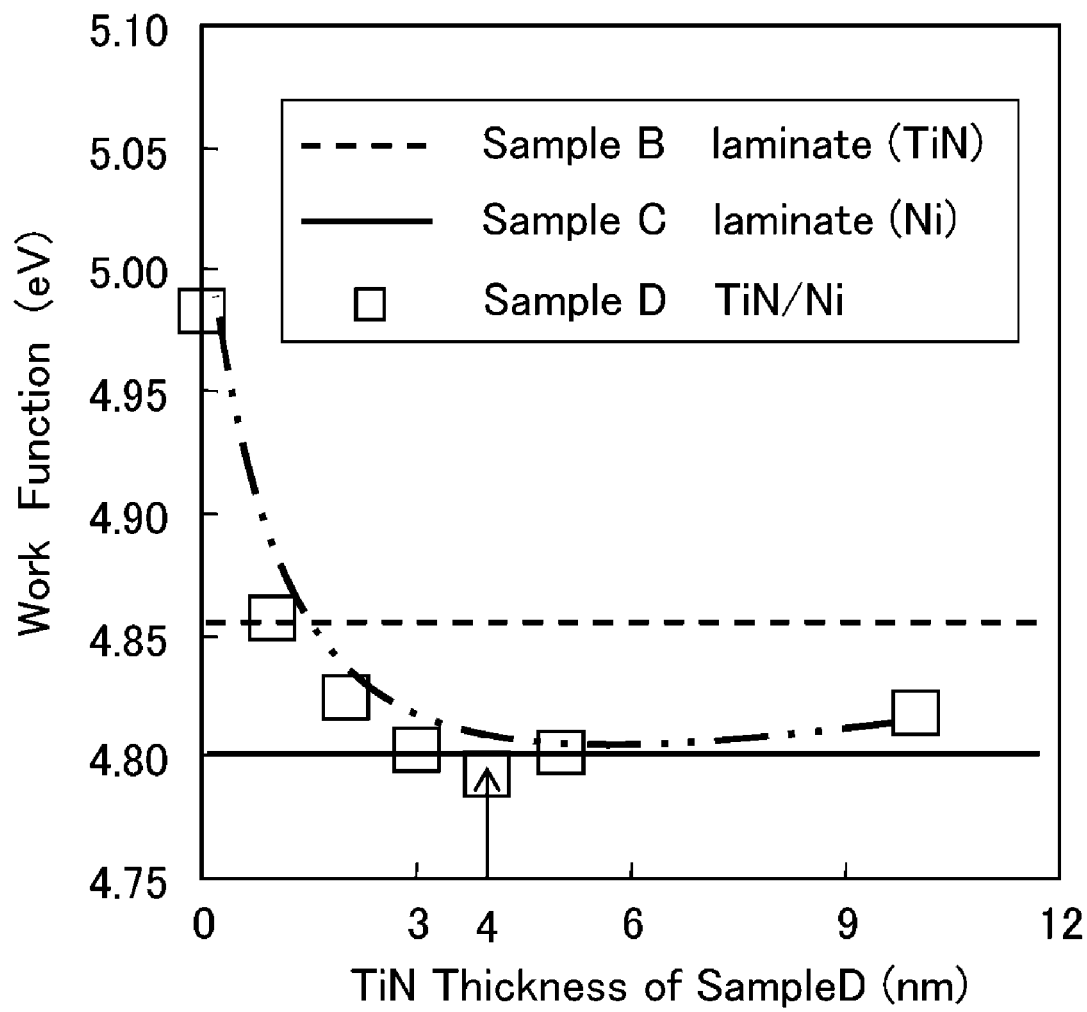
FIG. 16B is a graph illustrating a relationship between work function and TiN film thickness of the sample D together with those of the sample B and sample C.

FIG. 16B is a graph illustrating a relationship between the work function of the metal film and the thickness of the TiN film of the sample D together with those of the sample B and sample C. In FIG. 16B, the vertical axis denotes the work function (eV) of metal films, and the horizontal axis denotes the thickness (nm) of the TiN film of the sample D (example 2). In FIG. 16B, the symbol □ denotes the work function of the metal film of the sample D, the solid line denotes the work function of the metal film of the sample C, and the dashed line denotes the work function of the metal film of the sample B. Referring to FIG. 16B, in the range where the thickness of the TiN film of the sample D is 4 nm or less, the effective work function of the entire metal film having a stacked structure of the TiN film and the Ni film can approach the work function of the Ni film (about 5.15 eV). However, when the thickness of the TiN film is greater than 4 nm, since the effect of the work function of TiN increases, the effective work function of the entire metal film is decreased. Therefore, it is preferable that the thickness of the TiN film is 4.0 nm or less.

Another Embodiment of the Invention

Furthermore, in the above-described embodiments, an explanation has been given on the case of performing a film-forming process using a single-wafer type substrate processing apparatus configured to process a substrate at a time. However, the present invention is not limited thereto. For example, a batch type vertical apparatus configured to process a plurality of substrates at a time may be used as a substrate processing apparatus to perform a substrate processing process.

Figure 17A:
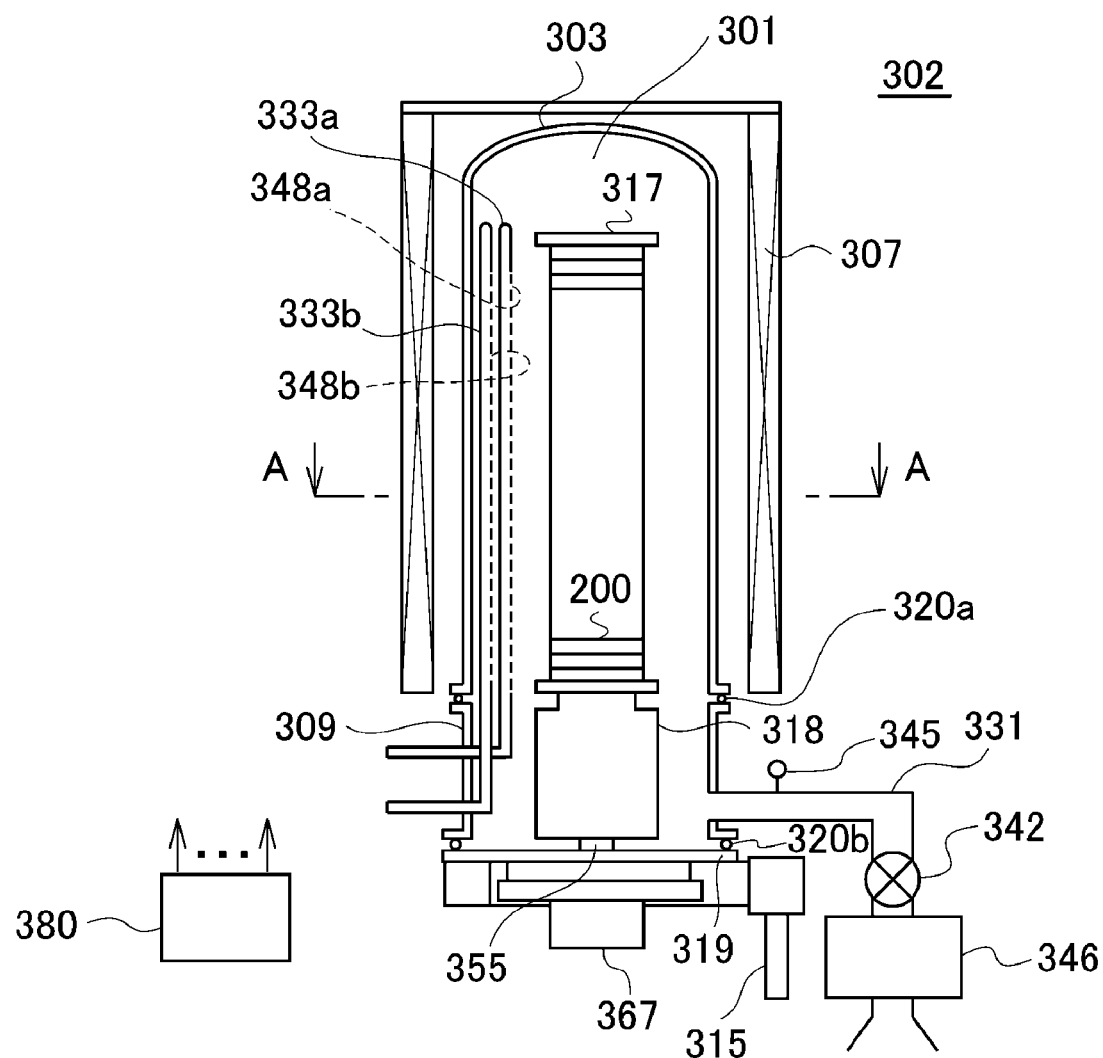
Figure 17B:
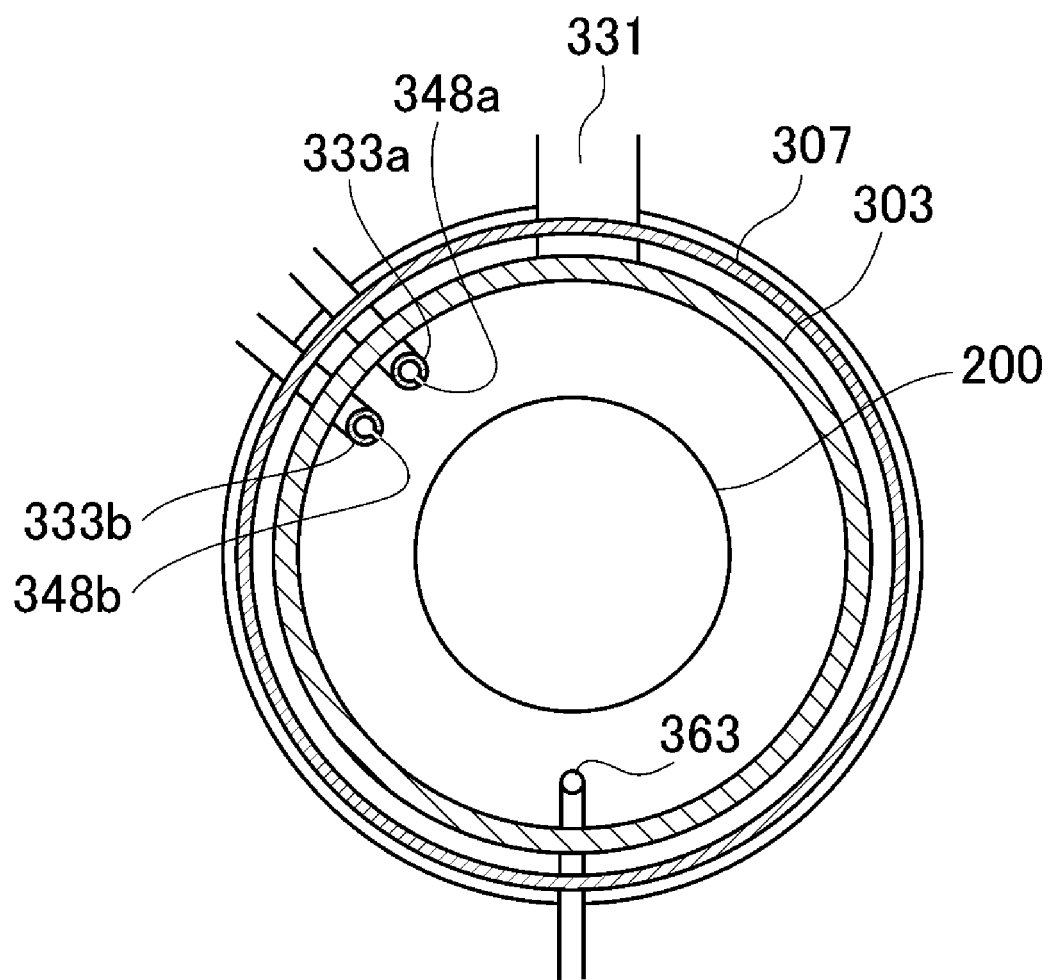

FIG. 17A and FIG. 17B are schematic views illustrating a vertical process furnace 302 of a vertical apparatus that can be suitably used according to an embodiment of the present invention, in which FIG. 17A is a vertical sectional view of the process furnace 302, and FIG. 17B is a sectional view of the process furnace 302 taken along line A-A of FIG. 17A.

As shown in FIG. 17A, the process furnace 302 includes a heater 307 as a heating unit (heating mechanism). The heater 307 has a cylindrical shape and is supported on a holding plate such as a heater base so that the heater 307 can be vertically fixed.

Inside the heater 307, a process tube 303 is installed concentrically with the heater 307 as a reaction tube. The process tube 303 is made of a heat-resistant material such as quartz ($SiO_2$) and silicon carbide (SiC) and has a cylindrical shape with a closed top side and an opened bottom side. In the hollow part of the process tube 303, a process chamber 301 is formed, which is configured to accommodate substrates such as wafers 200 in a state where the wafers 200 are horizontally positioned and vertically arranged in multiple stages in a boat 317 (described later).

At the lower side of the process tube 303, a manifold 309 is installed concentrically with the process tube 303. The manifold 309 is made of a material such as stainless steel and has a cylindrical shape with opened top and bottom sides. The manifold 309 is engaged with the process tube 303 and installed to support the process tube 303. Between the manifold 309 and the process tube 303, an O-ring 320a is installed as a seal member. The manifold 309 is supported by the heater base such that the process tube 303 can be vertically fixed. The process tube 303 and the manifold 309 constitute a reaction vessel.

A first nozzle 333a as a first gas introducing part, and a second nozzle 333b as a second gas introducing part are connected to the manifold 309 in a manner such that the first and second nozzles 333a and 333b penetrate the sidewall of the manifold 309. Each of the first and second nozzles 333a and 333b has an L-shape with a horizontal part and a vertical part. The horizontal part is connected to the manifold 309, and the vertical part is erected in an arc-shaped space between the inner wall of the process tube 303 and the wafers 200 along the inner wall of the process tube 303 from the lower side to the upper side in the arranged direction of the wafers 200. In the lateral sides of the vertical parts of the first and second nozzles 333a and 333b, first gas supply holes 348a and second gas supply holes 348b are formed, respectively. The first and second gas supply holes 348a and 348b have the same size and are arranged at the same pitch from the lower side to the upper side.

The same gas supply systems as those explained in the previous embodiment are connected to the first and second nozzles 333a and 333b. However, the current embodiment is different from the previous embodiment, in that the first source gas supply system and the second source gas supply system are connected to the first nozzle 333a, and the reaction gas supply system is connected to the second nozzle 333b. That is, in the current embodiment, source gases (the first source gas and the second source gas) are supplied through a nozzle different from a nozzle used to supply a reaction gas. Alternatively, the first source gas and the source gas may be supplied through different nozzles.

At the manifold 309, an exhaust pipe 331 is installed to exhaust the inside atmosphere of the process chamber 301. A vacuum exhaust device such as a vacuum pump 346 is connected to the exhaust pipe 331 through a pressure detector such a pressure sensor 345 and a pressure regulator such as an auto pressure controller (APC) valve 342, and based on pressure information detected by the pressure sensor 345, the APC valve 342 is controlled so that the inside of the process chamber 301 can be vacuum-evacuated to a predetermined pressure (vacuum degree). The APC valve 342 is an on-off valve configured to be opened and closed to start and stop vacuum evacuation of the inside of the process chamber 301, and configured to be adjusted in valve opening degree for adjusting the inside pressure of the process chamber 301.

At the lower side of the manifold 309, a seal cap 319 is installed as a furnace port cover capable of hermetically closing the opened bottom side of the manifold 309. The seal cap 319 is configured to be brought into contact with the manifold 309 in a vertical direction from the bottom side of the manifold 309. The seal cap 319 is made of a metal such as stainless steel and has a circular disk shape. On the top surface of the seal cap 319, an O-ring 320b is installed as a seal member configured to make contact with the bottom side of the manifold 309. At a side of the seal cap 319 opposite to the process chamber 301, a rotary mechanism 367 is installed to rotate the boat 317 (described later). A rotation shaft 355 of the rotary mechanism 367 is inserted through the seal cap 319 and is connected to the boat 317, so as to rotate the wafers 200 by rotating the boat 317. The seal cap 319 is configured to be vertically moved by a boat elevator 315 which is disposed at the outside of the process tube 303 as an elevating mechanism, and by this, the boat 317 can be loaded into and out of the process chamber 301.

The boat 317 which is a substrate holding tool is made of a heat-resistant material such as quartz or silicon carbide and is configured to hold a plurality of wafers 200 in a state where the wafers 200 are horizontally positioned and arranged in multiple stages with the centers of the wafers 200 being aligned. At the lower part of the boat 317, an insulating member 318 made of a heat-resistant material such as quartz or silicon carbide is installed to prevent heat transfer from the heater 307 to the seal cap 319. In the process tube 303, a temperature sensor 363 is installed as a temperature detector, and based on temperature information detected by the temperature sensor 363, power supplied to the heater 307 is controlled to obtain a desired temperature distribution in the process chamber 301. Like the first nozzle 333a and the second nozzle 333b, the temperature sensor 363 is installed along the inner wall of the process tube 303.

A controller 380 which is a controller (control part) is configured to control operations of parts such as the APC valve 342, the heater 307, the temperature sensor 363, the vacuum pump 346, the rotary mechanism 367, the boat elevator 315, the valves va1 to va5, vb1 to vb5, vc1 to vc3, vd1 and vd2, and ve1 to ve3, and the MFCs 222a, 222b, 222c, 222d, and 222e.

Next, an explanation will be given on a substrate processing process which is one of semiconductor device manufacturing processes for forming a thin film on a wafer 200 by a CVD method using the process furnace 302 of the vertical apparatus. In the following description, each part of the vertical apparatus is controlled by the controller 380.

A plurality of wafers 200 are charged into the boat 317 (wafer charging). Then, as shown in FIG. 17A, the boat 317 in which the plurality of wafers 200 are held is lifted and loaded into the process chamber 301 by the boat elevator 315 (boat loading). In this state, the bottom side of the manifold 309 is sealed by the seal cap 319 with the O-ring 320b being disposed therebetween.

The inside of the process chamber 301 is vacuum-evacuated to a desired pressure (vacuum degree) by the vacuum pump 346. At this time, the inside pressure of the process chamber 301 is measured by the pressure sensor 345, and based on the measured pressure, the APC valve 342 is feedback-controlled. In addition, the inside of the process chamber 301 is heated to a desired temperature by the heater 307. At this time, so as to obtain a desired temperature distribution in the process chamber 301, power to the heater 307 is feedback-controlled based on temperature information detected by the temperature sensor 363. Then, the rotary mechanism 367 rotates the boat 317 to rotate the wafers 200.

Then, according to a sequence similar to the sequence of the TiN film-forming process S5 to the TiN cap film-forming process S12, metal films having a stacked structure constituted by a TiN film and a Ni film are formed on $TiO_2$ films previously formed on the wafers 200, and then TiN films (TiN cap films) having a predetermined thickness are formed on the metal films. Thereafter, according to a sequence similar to the remaining gas removing process S13, a remaining gas removing process is performed.

After that, the boat elevator 315 lowers the seal cap 319 to open the bottom side of the manifold 309 and unload the boat 317 from the process tube 303 through the opened bottom side of the manifold 309 in a state where the wafers 200 on which the metal films and the TiN cap films having predetermined thicknesses are formed are held in the boat 317 (boat unloading). Thereafter, the processed wafers 200 are discharged from the boat 317 (wafer discharging).

Although the vertical apparatus is used in the current embodiment, processes similar to the substrate processing processes of the above-described embodiment can be performed to obtain similar effects.

Another Embodiment of the Invention

Figure 18:
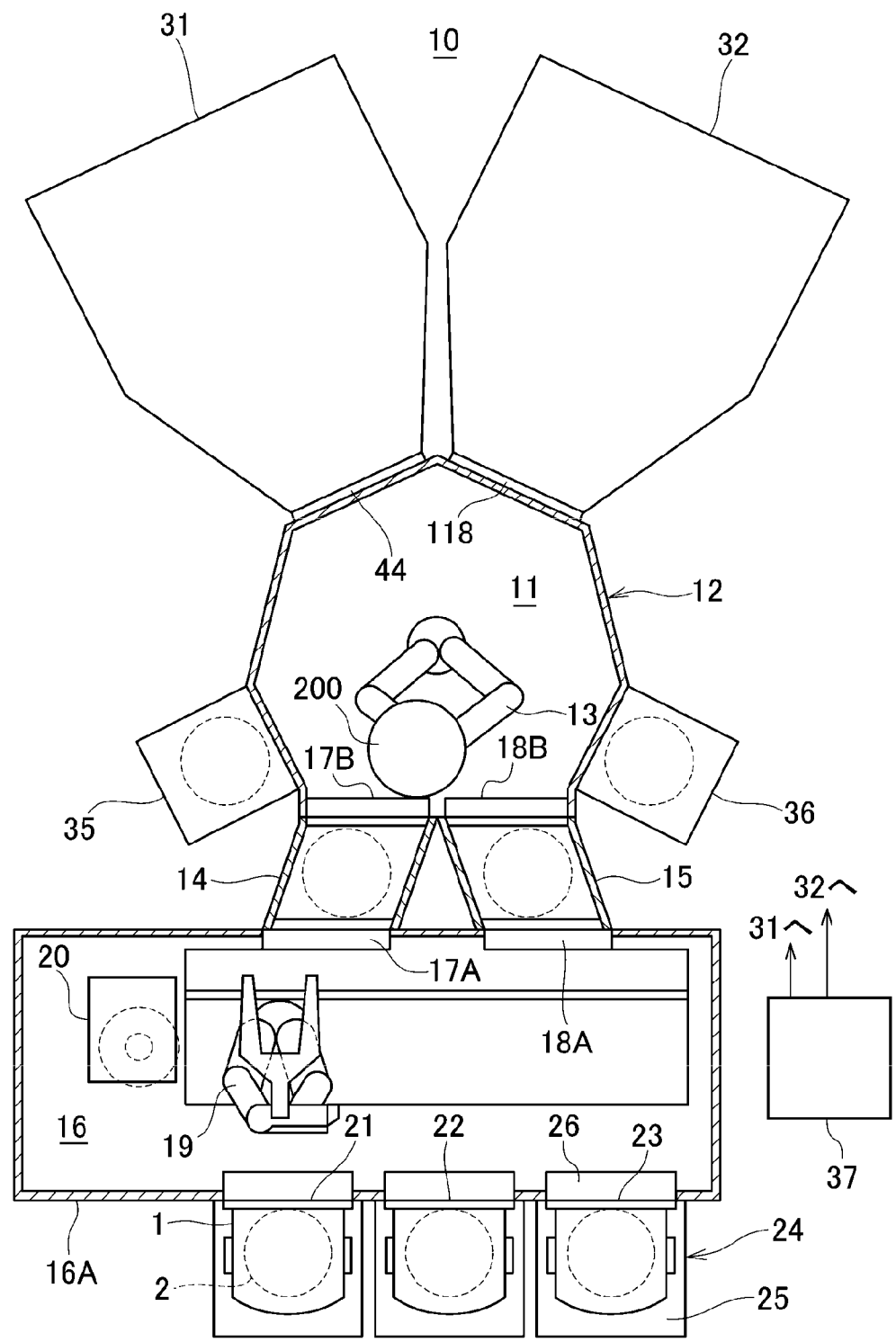
FIG. 18 is a schematic view illustrating a cluster apparatus according to another embodiment of the present invention.

In the above-described embodiments, an explanation has been given on the case where a TiN film and a Ni film are formed in the same process chamber. However, the present invention is not limited thereto. For example, a TiN film and a Ni film may be formed in different process chambers. In that case, as shown in FIG. 18, a substrate processing apparatus (cluster apparatus), such as a multi-chamber type substrate processing system including a plurality of process chambers, may be used. Hereinafter, an explanation will be given on an exemplary case where a TiN film and a Ni film are formed in different process chambers of the cluster apparatus. In the cluster apparatus of the current embodiment, Front Opening Unified Pods (FOUPs, hereinafter referred to as pods) 1 are used as wafer carrying carriers (substrate containers) configured to carry wafers 200.

As shown in FIG. 18, the cluster apparatus 10 includes a first wafer transfer chamber 11 (hereinafter referred to as a negative pressure transfer chamber 11) as a transfer module (carrying chamber) configured to endure a pressure (negative pressure) lower than atmospheric pressure, and when viewed from the top, a case 12 (hereinafter referred to as a negative pressure transfer chamber case 12) of the negative pressure transfer chamber 11 has a heptagonal box shape with closed top and bottom sides. The negative pressure transfer chamber case 12 is configured as a carrying vessel (airtight vessel). At the center part of the negative pressure transfer chamber 11, a wafer transfer machine 13 (hereinafter referred to as a negative pressure transfer machine 13) is installed as a carrying robot configured to transfer a wafer 200 under a negative pressure condition.

As loadlock modules (loadlock chambers), a carrying-in preliminary chamber 14 (hereinafter referred to as a carrying-in chamber 14) and a carrying-out preliminary chamber 15 (hereinafter referred as a carrying-out chamber 15) are closely disposed and connected to the biggest sidewall (front wall) of the seven sidewalls of the negative pressure transfer chamber case 12. When viewed from the top, each of a case of the carrying-in chamber 14 and a case of the carrying-out chamber 15 is formed in an approximately rhombic shape with closed top and bottom sides and is configured as a loadlock chamber capable of enduring a negative pressure condition.

A second wafer transfer chamber 16 (hereinafter referred to as a positive pressure transfer chamber 16), which is a front end module configured to be kept at atmospheric pressure or higher (hereinafter referred to as a positive pressure), is connected to sides of the carrying-in chamber 14 and the carrying-out chamber 15 opposite to the negative pressure transfer chamber 11, and when viewed from the top, a case of the positive pressure transfer chamber 16 has a horizontally elongated rectangular shape with closed top and bottom sides. Between the carrying-in chamber 14 and the positive pressure transfer chamber 16, a gate valve 17A is installed, and between the carrying-in chamber 14 and the negative pressure transfer chamber 11, a gate valve 17B is installed. Between the carrying-out chamber 15 and the positive pressure transfer chamber 16, a gate valve 18A is installed, and between the carrying-out chamber 15 and the negative pressure transfer chamber 11, a gate valve 18B is installed. In the positive pressure transfer chamber 16, a second wafer transfer machine 19 (hereinafter referred to as a positive pressure transfer machine 19) is installed as a carrying robot configured to transfer a wafer 200 under a positive pressure condition. The positive pressure transfer machine 19 is configured to be moved upward and downward by an elevator installed at the positive pressure transfer chamber 16, and is also configured to reciprocate left and right by a linear actuator. At the left end part of the positive pressure transfer chamber 16, a notch aligning device 20 is installed.

At the front wall of the positive pressure transfer chamber 16, three wafer carrying entrances 21, 22, and 23 are formed in a closed arranged fashion so that wafers 200 can be carried into and out of the positive pressure transfer chamber 16 through the wafer carrying entrances 21, 22, and 23. Pod openers 24 are installed at the wafer carrying entrances 21, 22, and 23, respectively. Each of the pod openers 24 includes a stage 25 on which a pod 1 can be placed, and a cap attachment/detachment mechanism 26 configured to attach/detach a cap to/from a pod 1 placed on the stage 25. By attaching/detaching a cap to/from a pod 1 placed on the stage 25 by using the pod opener 24, a wafer taking in/out entrance of the pod 1 can be closed or opened. Pods 1 are supplied to the stages 25 of the pod openers 24 and taken away from the stages 25 of the pod openers 24 by an in-process carrying device (rail guided vehicle, RGV).

As shown in FIG. 18, as processing modules, a first process unit 31 (TiN film-forming unit 31) and a second process unit 32 (Ni film-forming unit 32) are closely disposed and respectively connected to two sidewalls (rear walls) of the seven sidewalls of the negative pressure transfer chamber case 12 opposite to the positive pressure transfer chamber 16. The first process unit 31 and the second process unit 32 have a structure similar to the substrate processing apparatus of the above-described embodiment. A first source supply system and a reaction gas supply system are installed at the first process unit 31 but a second source supply system is not installed at the first process unit 31, and a second source supply system is installed at the second process unit 32 but a first source supply system and a reaction gas supply system are not installed at the second process unit 32. This is a difference from the above-described embodiment.

Between the first process unit 31 and the negative pressure transfer chamber 11, a gate valve 44 is installed. Between the second process unit 32 and the negative pressure transfer chamber 11, a gate valve 118 is installed. In addition, as cooling stages, a first cooling unit 35 and a second cooling unit 36 are respectively connected to two sidewalls of the seven sidewalls of the negative pressure transfer chamber case 12 that face the positive pressure transfer chamber 16, and each of the first and second cooling units 35 and 36 functions as a cooling chamber for cooling a processed wafer 200.

The cluster apparatus 10 includes a main controller 37 for overall controlling of substrate processing flows. The main controller 37 controls each part of the cluster apparatus 10.

Next, process that a metal film having a stacked structure constituted by a TiN film and a Ni film is formed on a $TiO_2$ film previously formed on a wafer 200, and then a TiN film (TiN cap film) having a predetermined thickness is formed on the metal film will now be explained. In the following description, each part of the cluster apparatus 10 is controlled by the main controller 37.

A cap of a pod 1 placed on the stage 25 of the cluster apparatus 10 is detached by the cap attachment/detachment mechanism 26, and thus a wafer taking in/out entrance of the pod 1 is opened. After the pod 1 is opened, the positive pressure transfer machine 19 installed at the positive pressure transfer chamber 16 picks up wafers 200 one by one from the pod 1 through the wafer carrying entrance and carries the wafers 200 to the carrying-in chamber 14 where the wafers 200 are placed on a carrying-in chamber temporary stage. During this operation, the gate valve 17A disposed at a side of the carrying-in chamber 14 facing the positive pressure transfer chamber 16 is in an opened state; the gate valve 17B disposed at the other side of the carrying-in chamber 14 facing the negative pressure transfer chamber 11 is in a closed state; and the inside of the negative pressure transfer chamber 11 is kept at, for example, 100 Pa.

The side of the carrying-in chamber 14 facing the positive pressure transfer chamber 16 is closed by the gate valve 17A, and the carrying-in chamber 14 is exhausted to a negative pressure by an exhaust device. When the inside pressure of the carrying-in chamber 14 is reduced to a preset pressure, the gate valve 17B disposed at the other side of the carrying-in chamber 14 facing the negative pressure transfer chamber 11 is opened. Next, the negative pressure transfer machine 13 of the negative pressure transfer chamber 11 picks up the wafers 200 one by one from the carrying-in chamber temporary stage and carries the wafers 200 into the negative pressure transfer chamber 11. Thereafter, the gate valve 17B disposed at the other side of the carrying-in chamber 14 facing the negative pressure transfer chamber 11 is closed.

Subsequently, the gate valve 44 of the first process unit 31 is opened, and the negative pressure transfer machine 13 loads the wafer 200 into a process chamber of the first process unit 31 (wafer loading). When the wafer 200 is loaded into the process chamber of the first process unit 31, since the carrying-in chamber 14 and the negative pressure transfer chamber 11 are previously vacuum-evacuated, permeation of oxygen or moisture into the process chamber of the first process unit 31 can be surely prevented. Then, according to a sequence similar to the sequence of the pressure adjusting process S3 to the TiN film-forming process S5 of the above-described embodiment, a TiN film is formed on a $TiO_2$ film previously formed on the wafer 200. After that, in the reverse sequence to the above-described sequence, the wafer 200 on which the TiN film is formed to have a predetermined thickness is unloaded from the process chamber of the first process unit 31 to the negative pressure transfer chamber 11.

Subsequently, the gate valve 118 of the second process unit 32 is opened, and the negative pressure transfer machine 13 loads the wafer 200 into a process chamber of the second process unit 32 (wafer loading). When the wafer 200 is loaded into the process chamber of the second process unit 32, since the carrying-in chamber 14 and the negative pressure chamber 11 are previously vacuum-evacuated, permeation of oxygen or moisture into the process chamber of the second process unit 32 can be surely prevented. Then, according to a sequence similar to the sequence of the pressure adjusting process S6 to the Ni film-forming process S8 of the above-described embodiment, a Ni film is formed on the TiN film formed over the wafer 200 in the first process unit 31. After that, in the reverse sequence to the above-described sequence, the wafer 200 over which the Ni film is formed to have a predetermined thickness is unloaded from the process chamber of the second process unit 32 to the negative pressure transfer chamber 11.

Then, according to a sequence similar to the sequence of the predetermined-time executing process S9 of the above-described embodiment, the TiN film-forming process using the first process unit 31 and the Ni film-forming process using the second process unit 32 are set as one cycle, and the cycle is performed predetermined times so as to form a metal film having a stacked structure of TiN film and Ni film on the $TiO_2$ film previously formed on the wafer 200.

Subsequently, the gate valve 44 of the first process unit 31 is opened, and the negative pressure transfer machine 13 loads the wafer 200 into the process chamber of the first process unit 31 (wafer loading). Then, according to a sequence similar to the sequence of the pressure adjusting process S10 to the TiN cap film-forming process S12, a TiN film (TiN cap film) having a predetermined thickness is formed on the metal film having a stacked structure of TiN film and Ni film. After that, in the reverse sequence to the above-described sequence, the wafer 200 over which the TiN film is formed to have a predetermined thickness is unloaded from the process chamber of the first process unit 31 to the negative pressure transfer chamber 11.

Thereafter, the side of the carrying-out chamber 15 facing the negative pressure chamber 11 is opened by the gate valve 18B, and the negative pressure transfer machine 13 carries the wafer 200 from the negative pressure chamber 11 to the carrying-out chamber 15, and the wafer 200 is transferred to a carrying-out chamber temporary stage. For this, the side of the carrying-out chamber 15 facing the positive pressure transfer chamber 16 is previously closed by the gate valve 18A, and the carrying-out chamber 15 is exhausted to a negative pressure by an exhaust device. After the pressure of the carrying-out chamber 15 is decreased to a preset value, the side of the carrying-out chamber 15 facing the negative pressure chamber 11 is opened by the gate valve 18B, and the wafer 200 is unloaded. After the wafer 200 is unloaded, the gate valve 18B is closed.

By repeating the above-described actions, twenty five wafers 200 batch-loaded in the chamber 14 can be sequentially processed through the above-described processes. After the twenty five wafers 200 are sequentially processed, the processed wafers 200 are collected on the temporary stage of the carrying-out chamber 15.

Thereafter, nitrogen gas is supplied into the carrying-out chamber 15 which is kept at a negative pressure so as to adjust the inside pressure of the carrying-out chamber 15 to atmospheric pressure, and then the side of the carrying-out chamber 15 facing the positive pressure transfer chamber 16 is opened by the gate valve 18A. Next, a cap of an empty pod 1 placed on the stage 25 is opened by the cap attachment/detachment mechanism 26 of the pod opener 24. Subsequently, the positive pressure transfer machine 19 of the positive pressure transfer chamber 16 picks up the wafers 200 from the carrying-out chamber 15 to the positive pressure transfer chamber 16 and carries the wafers 200 into the pod 1 through the wafer carrying entrance 23 of the positive pressure transfer chamber 16. After the processed twenty five wafers 200 are carried into the pod 1, the cap of the pod 1 is attached to the wafer taking in/out entrance of the pod 1 by the cap attachment/detachment mechanism 26 of the pod opener 24 so that the pod 1 is closed.

A process similar to the substrate processing process of the above-described embodiment can be performed by using the cluster apparatus 10 of the current embodiment, and effects similar to those of the above-described embodiment can be obtained. In the case where process conditions (particularly, a process temperature) for forming a first metal film are different from process conditions (particularly, a process temperature) for forming a second metal film, the first and second metal films may be formed in different process chambers like in the current embodiment.

Furthermore, examples of a gate electrode forming process include: a gate first process in which a source/drain diffusion layer is formed by performing about 1000-° C. annealing, that is, activation annealing (spike annealing) after a gate electrode is formed; and a gate last process in which such a source/drain diffusion layer is formed before a gate electrode is formed. In the case of a gate first process, a gate electrode is heated to about 1,000° C. during activation annealing, and thus the present invention may be unsuitable for a gate first process because a TiN film does not have oxidation resistance in a temperature region of about 1,000° C. However, in the case of a gate last process, a gate electrode is not heated to a temperature about 1,000° C., and a TiN film has oxidation resistance in temperature regions of processes that are performed after the gate electrode is formed. Thus, the present invention may be suitable for a gate last process. That is, the present invention can be suitably applied to the case where a gate electrode is formed through a gate last process. Furthermore, in a process of manufacturing a dynamic random access memory (DRAM), annealing is performed at about 400° C. under a $H_2$-gas atmosphere after a capacitor electrode is formed. In a DRAM manufacturing process, a capacitor electrode is heated to about 400° C. at most, and in such a temperature condition, TiN has high oxidation resistance as compared with Ni. That is, the present invention can be suitably applied to the case where a capacitor electrode of a DRAM is manufactured.

As described above, the present invention provides a semiconductor device including a metal film which can be formed with lower costs but have a necessary work function and oxidation resistance. In addition, according to the present invention, there are provided a method of manufacturing a semiconductor device and a substrate processing apparatus, which are designed to form a metal film having a necessary work function and oxidation resistance with lower costs.

SUPPLEMENTARY NOTE

The present invention also includes the following preferred embodiments.

According to an embodiment of the present invention, there is provided a semiconductor device including: an insulating film disposed on a substrate; and a metal film disposed adjacent to the insulating film, wherein the metal film includes a stacked structure of a first metal film and a second metal film, an oxidation resistance of the first metal film is greater than that of the second metal film, the second metal film has a work function greater than 4.8 eV and is different from the first metal film in material, and the first metal film is disposed between the second metal film and the insulating film.

Preferably, the metal film is disposed on the insulating film, and further includes the first metal film disposed on an outermost surface thereof Preferably, the stacked structure is repeatedly stacked in the metal film.

Preferably, a thickness of the first metal film ranges from 0.2 nm to 4 nm.

Preferably, a thickness of the second metal film ranges from 0.5 nm to 10 nm.

Preferably, a thickness of the second metal film ranges from 4 nm to 5 nm.

Preferably, the second metal film is thicker than the first metal film.

Preferably, the first metal film includes one of a titanium nitride film, a tantalum nitride film, a titanium aluminum nitride film, and a tantalum aluminum nitride film.

Preferably, the second metal film includes a non-noble metal.

Preferably, the second metal film includes at least one of a nickel film, a cobalt film, a beryllium film, a carbon film, a selenium film, a tellurium film and a rhenium film.

Preferably, the insulating film includes a high permittivity film.

Preferably, the insulating film includes at least one of a hafnium oxide film, a zirconium oxide film, a hafnium oxide film doped with an aluminum, a zirconium oxide film doped with the aluminum, a titanium oxide film, a niobium oxide film, a tantalum oxide film, a strontium titanate film, a barium strontium titanate film and a lead zirconate titanate film.

According to another embodiment of the present invention, there is provided a method of manufacturing a semiconductor device, the method including: forming an insulating film on a substrate; and forming a metal film including a stacked structure of a first metal film and a second metal film adjacent to the insulating film, the first metal film being formed between the second metal film and the insulating film, wherein an oxidation resistance of the first metal film is greater than that of the second metal film, and the second metal film has a work function greater than 4.8 eV and is different from the first metal film in material.

According to another embodiment of the present invention, there is provided a substrate processing apparatus including: a process chamber configured to process a substrate; a first process gas supply system configured to supply a first process gas into the process chamber to form a first metal film; a second process gas supply system configured to supply a second process gas into the process chamber to form a second metal film; and a controller configured to control the first process gas supply system and the second process gas supply system, wherein an oxidation resistance of the first metal film is greater than that of the second metal film, the second metal film has a work function greater than 4.8 eV and is different from the first metal film in material, and the controller controls the first process gas supply system and the second process gas supply system to form a metal film having a stacked structure of the first metal film and the second metal film adjacent to an insulating film disposed on the substrate by supplying the first process gas and the second process gas into the process chamber where the substrate is accommodated such that the first metal film is formed between the second metal film and the insulating film.

According to another embodiment of the present invention, there is provided a substrate processing apparatus including: a first process chamber configured to process a substrate; a first process gas supply system configured to supply a first process gas into the first process chamber to form a first metal film; a second process chamber configured to process the substrate; a second process gas supply system configured to supply a second process gas into the second process chamber to form a second metal film; a carrying chamber disposed between the first process chamber and the second process chamber for carrying the substrate; a carrying robot installed in the carrying chamber to carry the substrate between the first process chamber and the second process chamber; and a controller configured to control the first process gas supply system, the second process gas supply system and the carrying robot, wherein an oxidation resistance of the first metal film is greater than that of the second metal film, the second metal film has a work function greater than 4.8 eV and is different from the first metal film in material, and the controller controls the first process gas supply system, the second process gas supply system and the carrying robot to form a metal film having a stacked structure of the first metal film and the second metal film adjacent to an insulating film disposed on the substrate by carrying the substrate into the first process chamber, supplying the first process gas into the first process chamber, carrying the substrate into the second process chamber, and supplying the second process gas into the process chamber such that the first metal film is formed between the second metal film and the insulating film.

What is claimed is:

1. A method of manufacturing a semiconductor device, the method comprising:
    forming an insulating film on a substrate; and
    forming a metal film comprising a stacked structure of a laminated film where a first metal film and a second metal film are laminated repeatedly; and a capping metal film disposed on the laminated film, the first metal film at a bottom of the metal film being disposed on the insulating film to directly contact the insulating film, the capping metal film being disposed on the second metal film at a top of the metal film to directly contact the second metal film, the second metal film having a work function greater than 4.8 eV and being different from the first metal film in material, and the capping metal film being constituted by a same material as the first metal film, wherein oxidation resistances of the first metal film and the capping metal film are greater than that of the second metal film.

2. The method of claim 1, wherein a thickness of the first metal film ranges from 0.2 nm to 4 nm.

3. The method of claim 1, wherein a thickness of the second metal film ranges from 0.5 nm to 10 nm.

4. The method of claim 1, wherein a thickness of the second metal film ranges from 4 nm to 5 nm.

5. The method of claim 1, wherein the second metal film is thicker than the first metal film.

6. The method of claim 1, wherein the first metal film comprises at least one selected from a group consisting of a titanium nitride film, a tantalum nitride film, a titanium aluminum nitride film and a tantalum aluminum nitride film.

7. The method of claim 1, wherein the second metal comprises a non-noble metal.

8. The method of claim 1, wherein the second metal film comprises at least one selected from a group consisting of a nickel film, a cobalt film, a beryllium film, a carbon film, a selenium film, a tellurium film and a rhenium film.

9. The method of claim 1, wherein the insulating film comprises a high permittivity film.

10. The method of claim 1, wherein the insulating film comprises at least one selected from a group consisting of a hafnium oxide film, a zirconium oxide film, a hafnium oxide film doped with an aluminum, a zirconium oxide film doped with the aluminum, a titanium oxide film, a niobium oxide film, a tantalum oxide film, a strontium titanate film, a barium strontium titanate film and a lead zirconate titanate film.

11. A method of manufacturing a semiconductor device, the method comprising:
    forming an insulating film on a substrate; and
    forming a metal film comprising a stacked structure of a laminated film where a first metal film and a second metal film are laminated repeatedly; and a third metal film disposed on the laminated film, the first metal film at a bottom of the metal film being disposed on the insulating film to directly contact the insulating film, the third metal film being disposed on the second metal film at a top of the metal film to directly contact the second metal film, the second metal film having a work function greater than 4.8 eV and being different from the first metal film in material, and the third metal film being constituted by a same material as the first metal film, wherein oxidation resistances of the first metal film and the third metal film are greater than that of the second metal film.

* * * * *